(12) United States Patent
Kokubun et al.

(10) Patent No.: US 8,823,123 B2
(45) Date of Patent: Sep. 2, 2014

(54) SOLID-STATE IMAGE SENSOR

(75) Inventors: Koichi Kokubun, Kanagawa (JP);
Yusaku Konno, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 13/601,439

(22) Filed: Aug. 31, 2012

(65) Prior Publication Data

US 2013/0154041 A1 Jun. 20, 2013

(30) Foreign Application Priority Data

Dec. 20, 2011 (JP) ................. 2011-278646

(51) Int. Cl.
*H01L 31/0232* (2014.01)
*H01L 21/00* (2006.01)
*H01L 27/146* (2006.01)
*H01L 31/0216* (2014.01)

(52) U.S. Cl.
CPC .......... *H01L 27/146* (2013.01); *H01L 31/0232* (2013.01); *H01L 31/02165* (2013.01)
USPC .............. 257/432; 257/291; 257/E27.133; 257/E27.131; 257/E27.13; 257/E31.097; 438/70; 348/294; 348/302; 348/308

(58) Field of Classification Search
CPC ............ H01L 27/146; H01L 27/14612; H01L 27/14618; H01L 27/14621; H01L 27/14623; H01L 27/14627; H01L 27/14645; H01L 27/14683; H01L 27/14685; H01L 27/14689; H01L 27/3269; H04N 3/155; H04N 3/14; H04N 5/335; H04N 5/374
USPC .............. 257/59, 72, 440, 291, 432, E27.131, 257/E27.133, E27.13, E27.134, E27.135, 257/E27.138, E27.142, E27.15, E31.097; 348/294, 302, 308, E3.018, E5.001; 250/208.1; 438/70
See application file for complete search history.

(56) References Cited

U.S. PATENT DOCUMENTS

| | | | |
|---|---|---|---|
| 7,701,024 B2 | 4/2010 | Kasano et al. | |
| 2006/0285005 A1* | 12/2006 | Inaba et al. | 348/340 |
| 2008/0062359 A1* | 3/2008 | Inaba et al. | 349/105 |
| 2008/0251873 A1* | 10/2008 | Kasano et al. | 257/432 |

(Continued)

FOREIGN PATENT DOCUMENTS

| | | | |
|---|---|---|---|
| JP | 2008-170979 A | 7/2008 | |
| JP | 2009-004680 A | 1/2009 | |

(Continued)

*Primary Examiner* — Julio J Maldonado
*Assistant Examiner* — Moazzam Hossain
(74) *Attorney, Agent, or Firm* — Oblon, Spivak, McClelland, Maier & Neustadt, L.L.P.

(57) ABSTRACT

According to one embodiment, there is provided a solid-state image sensor including a photoelectric conversion layer, and a multilayer interference filter. The multilayer interference filter is arranged to conduct light of a particular color, of incident light, selectively to the photoelectric conversion layer. The multilayer interference filter has a laminate structure in which a first layer having a first refraction index and a second layer having a second refraction index are repeatedly laminated, and a third layer which is in contact with a lower surface of the laminate structure and has a third refraction index. A lowermost layer of the laminate structure is the second layer. The third refraction index is not equal to the first refraction index and is higher than the second refraction index.

20 Claims, 17 Drawing Sheets

(56) References Cited

U.S. PATENT DOCUMENTS

| | | | |
|---|---|---|---|
| 2009/0321865 A1* | 12/2009 | Kasano et al. | 257/432 |
| 2010/0084776 A1 | 4/2010 | Murozono et al. | |
| 2010/0244168 A1 | 9/2010 | Shiozawa et al. | |
| 2012/0001072 A1* | 1/2012 | Toda et al. | 250/339.05 |
| 2013/0241019 A1* | 9/2013 | Mizuta et al. | 257/432 |

FOREIGN PATENT DOCUMENTS

| | | |
|---|---|---|
| JP | 2009-072918 A | 4/2009 |
| JP | 2010-150106 A | 7/2010 |
| JP | 2010-225944 A | 10/2010 |
| JP | 2010-256633 A | 11/2010 |
| JP | 2011-022432 A | 2/2011 |

* cited by examiner

1i

SOLID-STATE IMAGE SENSOR

CROSS-REFERENCE TO RELATED APPLICATIONS

This application is based upon and claims the benefit of priority from Japanese Patent Application No. 2011-278646, filed on Dec. 20, 2011; the entire contents of which are incorporated herein by reference.

FIELD

Embodiments described herein relate generally to a solid-state image sensor.

BACKGROUND

Presently, color filters for use in image sensors are formed of organic pigments. As can be advanced hereafter, the technical trend in low profile representatively includes minimization of pixels (that is, increase in the number of pixels) and the backside illuminated type. For this technical trend, it can be estimated that it is difficult to process in accordance with the minimization of pixels or film thinning (contributing to the low profile) in a filter with organic pigments. To solve this problem, in recent years, there is proposed an interference filter which uses inorganic materials with a one-dimensional photonic crystal (in which a high refraction index material and a low refraction index material are periodically laminated). It is aspired to improve cross talk (color mixture) in such an interference filter.

DETAILED DESCRIPTION

In general, according to one embodiment, there is provided a solid-state image sensor including a photoelectric conversion layer, and a multilayer interference filter. The multilayer interference filter is arranged to conduct light of a particular color, of incident light, selectively to the photoelectric conversion layer. The multilayer interference filter has a laminate structure in which a first layer having a first refraction index and a second layer having a second refraction index are repeatedly laminated, and a third layer which is in contact with a lower surface of the laminate structure and has a third refraction index. A lowermost layer of the laminate structure is the second layer. The third refraction index is not equal to the first refraction index and is higher than the second refraction index.

Exemplary embodiments of a solid-state image sensor will be explained below in detail with reference to the accompanying drawings. The present invention is not limited to the following embodiments.

First Embodiment

Figure 1:
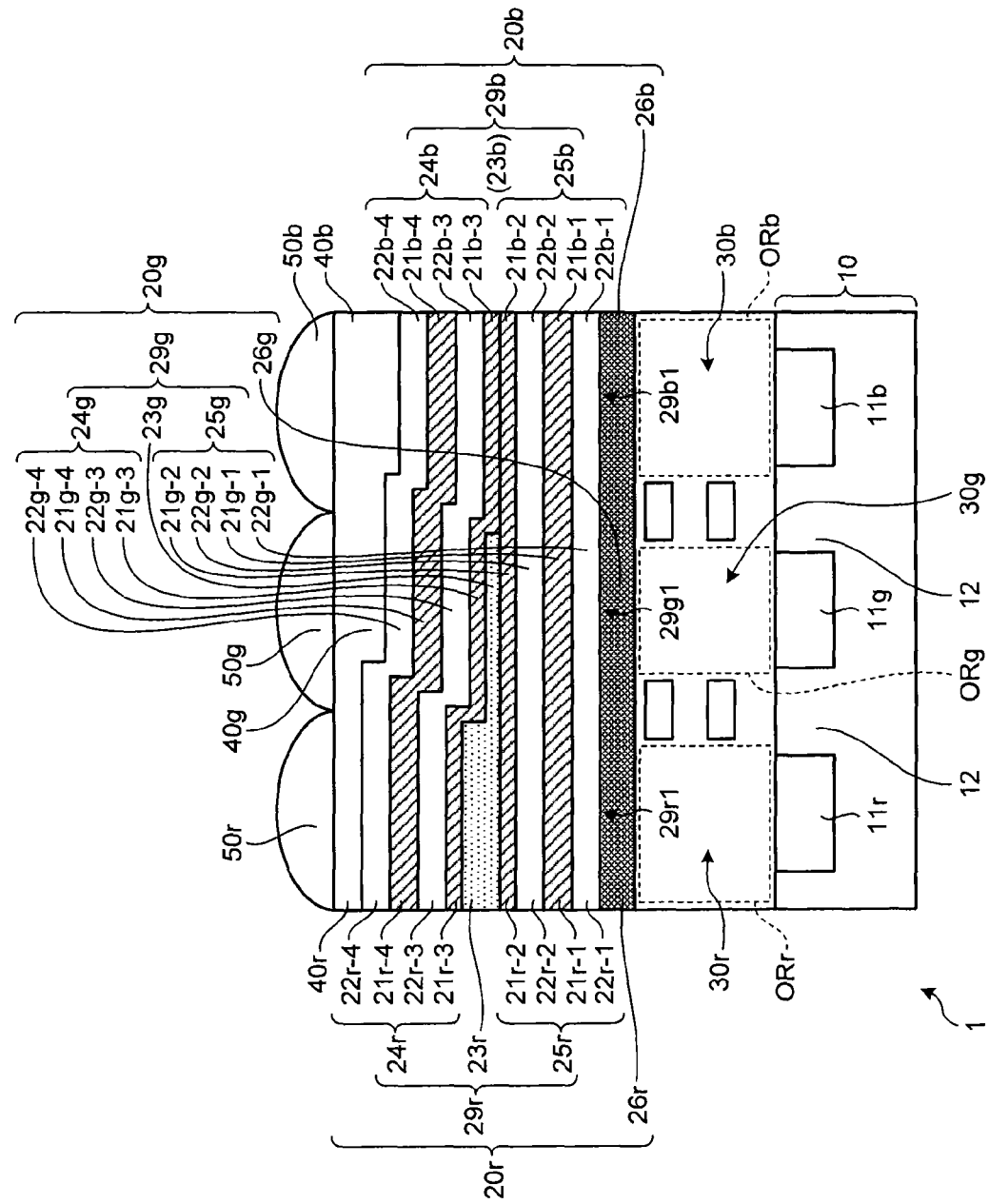
FIG. 1 is a diagram illustrating a configuration of a solid-state image sensor according to a first embodiment.

A solid-state image sensor according to the first embodiment will now be described using FIG. 1. FIG. 1 is a diagram exemplarily illustrating a cross sectional configuration of three pixels in the solid-state image sensor 1 according to the embodiment.

The solid-state image sensor 1 includes photoelectric conversion layers 11r, 11g, and 11b, multilayer wiring structures 30r, 30g, and 30b, multilayer interference filters 20r, 20g, and 20b, planarizing layers 40r, 40g, and 40b, and micro lenses 50r, 50g, and 50b.

The photoelectric conversion layers 11r, 11g, and 11b are arranged in a well region 12 of a semiconductor substrate 10. The photoelectric conversion layers 11r, 11g, and 11b receive rays of light respectively in wavelength ranges of red (R), green (G), and blue (B). The photoelectric conversion layers 11r, 11g, and 11b generate an electric charge corresponding to the received light and accumulate the electric charge. The photoelectric conversion layers 11r, 11g, and 11b are, for example, photodiodes, and include a charge accumulation region.

The well region 12 is formed of a semiconductor (for example, silicon) including first conductive (for example, P-type) impurities at a low concentration. The P-type impurities include, for example, boron. The charge accumulation region of the photoelectric conversion layers 11r, 11g, and 11b is formed of a semiconductor (for example, silicon). This semiconductor includes second conductive (N-type) impurities opposite from the first conductive type at a higher concentration than the concentration of the first conductive impurities in the well region 12. The N-type impurities include, for example, phosphorus, or arsenic.

The multilayer wiring structures 30r, 30g, and 30b are arranged on the semiconductor substrate 10. In the multilayer wiring structures 30r, 30g, and 30b, a plurality of wiring patterns are elongated in an interlayer insulating film. The multilayer wiring structures 30r, 30g, 30b provide opening regions ORr, ORg, ORb corresponding respectively to the photoelectric conversion layers 11r, 11g, and 11b. The interlayer insulating film is formed of a material including, for example, silicon oxide as the main component. The wiring pattern is formed of a material including, for example, metal as the main component.

The multilayer interference filter 20r is arranged above the photoelectric conversion layer 11r. As a result of this arrangement, the multilayer interference filter 20r selectively conducts light in a wavelength range of red (R) to the photoelectric conversion layer 11r, of the incident light. That is, the multilayer interference filter 20r serves as a color filter for red (R). The multilayer interference filter 20r is formed of inorganic substances. The multilayer interference filter 20r includes, for example, a photonic crystal type laminate structure 29r, as a filter for red, in which inorganic materials (low refraction index material and high refraction index material) are laminated.

Specifically, the multilayer interference filter 20r has the laminate structure 29r and a third layer 26r. The laminate structure 29r has an upper laminate structure 24r, an interference layer 23, and a lower laminate structure 25r. The upper laminate structure 24r and the lower laminate structure 25r function as mirrors with opposed reflection surfaces. At this time, the upper laminate structure 24r and the lower laminate structure 25r have a center wavelength (for example, 550 nm) corresponding to the center part of a visible region (for example, wavelength region between 400 nm and 700 nm). In the center wavelength, a reflection rate of the mirror reaches a peak. The interference layer 23r is arranged at the interface of the upper laminate structure 24r and the lower laminate structure 25r, and causes interference (multi-beam interference) of light multiply-reflected on the reflection surface of the upper laminate structure 24r and the lower laminate structure 25r. That is, the multilayer interference filter 20r functions based on the same principle as that of the Fabry-Perot interferometer.

In the upper laminate structure 24r, first layers 21r-3 and 21r-4 and second layers 22r-3 and 22r-4 are alternately laminated, and have different refraction indexes. In the upper laminate structure 24r, the first layer 21r-3, the second layer 22r-3, the first layer 21r-4, and the second layer 22r-4 are laminated sequentially in this order, for example.

In the lower laminate structure 25r, first layers 21r-1 and 21r-2 and second layers 22r-1 and 22r-2 are alternately laminated, and have different refraction indexes. In the lower laminate structure 25r, the second layer 22r-1, the first layer 21r-1, the second layer 22r-2, and the first layer 21r-2 are laminated sequentially in this order, for example.

The refraction indexes of the first layers 21r-1, 21r-2, 21r-3, and 21r-4 are greater than those of the second layers 22r-1, 22r-2, 22r-3, and 22r-4. The first layers 21r-1, 21r-2, 21r-3, and 21r-4 are formed of a material including titanium oxide ($TiO_2$) as the main component, and has a first refraction index n1 (for example, 2.5). The second layers 22r-1, 22r-2, 22r-3, and 22r-4 are formed of a material including silicon oxide ($SiO_2$) as the main component, and have a second refraction index n2 (for example, 1.46).

The refraction index of the interference layer 23r is lower than the refraction indexes of the first layers 21r-1, 21r-2, 21r-3, and 21r-4. The interference layer 23r is formed of a material including silicon oxide ($SiO_2$, refraction index: 1.46) as the main component, for example.

In the laminate structure 29r, the number of laminated layers of the upper laminate structure 24r is equal to the number of laminated layers of the lower laminate structure 25r, and is, for example, three. That is, in the laminate structure 29r, the number of layers except the interference layer 23r is six. Both of the lowermost layer (layer in contact with the upper surface of the interference layer 23r) of the upper laminate structure 24r and the uppermost layer (layer in contact with the lower surface of the interference layer 23r) of the lower laminate structure 25r are the first layers (21r-3 and 21r-2).

In the laminate structure 29r, in both of the upper laminate structure 24r and the lower laminate structure 25r, a part of a plurality of corresponding layers is thinner than the rest of layers. That is, in the upper laminate structure 24r and the lower laminate structure 25r, two of the first layers 21r-2 and 21r-3 (for example, 20 nm to 45 nm) are thinner than the rest of the first layers 21r-1 and 21r-4 (for example, 50 nm to 60 nm), of the plurality of layers 21r-1, 21r-2, 21r-3, and 21r-4. The rest of the first layers 21r-1 and 21r-4 have an equal thickness (for example, a thickness corresponding to an optical film thickness equal to one fourth of the center wavelength λ). In the upper laminate structure 24r and the lower laminate structure 25r, a plurality of second layers 22r-1, 22r-2, 22r-3, and 22r-4 have an equal thickness (for example, a thickness corresponding to an optical film thickness equal to one fourth of the center wavelength λ).

The third layer 26r is in contact with the lower side of a lower surface 29r1 of the laminate structure 29r. That is, the lowermost layer of the laminate structure 29r is the second layer 22r-1, and the third layer 26r is in contact with the lower surface of the second layer 22r-1. The third layer 26r is formed of a material including silicon nitride (SiN) as the main component, and has a third refraction index n3 (for example, 2.0).

The third refraction index n3 is not equal to the first refraction index n1, and is higher than the second refraction index n2. For example, when the second refraction index n2 is lower than the first refraction index n1, the third refraction index n3 (for example, 2.0) may be lower than the first refraction index n1 (for example, 2.5) and higher than the second refraction index n2 (for example, 1.46). As a result, of the incident light, color mixture components (light in a wavelength range except for red (R)) can selectively be reflected removed at the interface of the laminate structure 29r and the third layer 26r.

The multilayer interference filter 20g is arranged above the photoelectric conversion layer 11g. In this structure, of incident light, the multilayer interference filter 20g selectively conducts light in a wavelength range of green (G) to the photoelectric conversion layer 11g. That is, the multilayer interference filter 20g functions as a color filter for green (G). The multilayer interference filter 20g is formed of inorganic substance. The multilayer interference filter 20g includes a laminate structure 29g as a photonic crystal type filter for red in which, for example, inorganic materials (low refraction index material and high refraction index material) are laminated.

Specifically, the multilayer interference filter 20g has the laminate structure 29g and a third layer 26g. The laminate structure 29g has an upper laminate structure 24g, an interference layer 23g, and a lower laminate structure 25g. The upper laminate structure 24g and the lower laminate structure 25g function as opposed mirrors with the reflected surfaces. At this time, the upper laminate structure 24g and the lower laminate structure 25g have a center wavelength (for example, 550 nm) corresponding to the center part of a visible region (for example, wavelength region between 400 nm and 700 nm). In the center wavelength, the reflection rate of the mirror reaches a peak. The interference layer 23g is arranged at the interface of the upper laminate structure 24g and the lower laminate structure 25g, and causes interference (multi-beam interference) of light multiply-reflected on the reflection surface of the upper laminate structure 24g and the lower laminate structure 25g. That is, the multilayer interference filter 20g functions based on the same principle as that of the Fabry-Perot interferometer.

In the upper laminate structure 24g, first layers 21g-3 and 21g-4 and second layers 22g-3 and 22g-4 are alternately laminated, and have different refraction indexes. In the upper laminate structure 24g, the first layer 21g-3, the second layer 22g-3, the first layer 21g-4, and the second layer 22g-4 are laminated sequentially in this order, for example.

In the lower laminate structure 25g, first layers 21g-1 and 21g-2 and second layers 22g-1 and 22g-2 are alternately laminated, and have different refraction indexes. In the lower laminate structure 25g, for example, the second layer 22g-1, the first layer 21g-1, the second layer 22g-2, and the first layer 21g-2 are laminated sequentially in this order.

The refraction indexes of the first layers 21g-1, 21g-2, 21g-3, and 21g-4 are higher than that of the second layers 22g-1, 22g-2, 22g-3, and 22g-4. The first layers 21g-1, 21g-2, 21g-3, and 21g-4 are formed of a material including, for example, titanium oxide ($TiO_2$) as the main component, and have a first refraction index n1 (for example, 2.5). The second layers 22g-1, 22g-2, 22g-3, and 22g-4 are formed of a material including, for example, silicon oxide ($SiO_2$), and has a second refraction index n2 (for example, 1.46).

The refraction index of the interference layer 23g is lower than that of the first layers 21g-1, 21g-2, 21g-3, and 21g-4. The interference layer 23g is formed of a material including silicon oxide ($SiO_2$, refraction index: 1.46) as the main component.

In the laminate structure 29g, the number of laminated layers of the upper laminate structure 24g is equal to the number of laminated layers of the lower laminate structure 25g, and is, for example, 3. That is, in the laminate structure 29g, the number of laminated layers except the interference layer 23g is six. Both of the lowermost layer (layer in contact with the upper surface of the interference layer 23) of the upper laminate structure 24g and the uppermost layer (layer in contact with the lower surface of the interference layer 23g) of the lower laminate structure 25g are the first layers (21g-3 and 21g-2).

In the laminate structure 29g, in both of the upper laminate structure 24g and the lower laminate structure 25g, a part of a plurality of corresponding layers is thinner than the rest of layers. That is, in the upper laminate structure 24g and the lower laminate structure 25g, two of the first layers 21g-2 and 21g-3 are thinner (for example, 20 nm to 45 nm) than the rest of the first layers 21g-1 and 21g-4 (for example, 50 nm to 60 nm), of the plurality of first layers 21g-1, 21g-2, 21g-3, and 21g-4. The rest of the first layers 21g-1 and 21g-4 have an equal thickness (for example, a thickness corresponding to an optical film thickness equal to one fourth of the center wavelength λ). In the upper laminate structure 24g and the lower laminate structure 25g, a plurality of second layers 22g-1, 22g-2, 22g-3, and 22g-4 have an equal thickness (for example, a thickness corresponding to an optical film thickness equal to one fourth of the center wavelength λ).

The third layer 26g is in contact with the lower side of a lower surface 29g1 of the laminate structure 29g. That is, the lowermost layer of the laminate structure 29g is the second layer 22g-1, and the third layer 26g is in contact with the lower surface of the second layer 22g-1. The third layer 26g is formed of a material including silicon nitride (SiN) as the main component, and has a third refraction index n3 (for example, 2.0).

The third refraction index n3 is not equal to the first refraction index n1, and is higher than the second refraction index n2. For example, when the second refraction index n2 is lower than the first refraction index n1, the third refraction index n3 (for example, 2.0) may be lower than the first refraction index n1 (for example, 2.5) and may be higher than the second refraction index n2 (for example, 1.46). As a result, of incident light, color mixture components (light in a wavelength range except for green (G)) can selectively be reflected and removed at the interface of the laminate structure 29g and the third layer 26g.

The multilayer interference filter 20b is arranged above the photoelectric conversion layer 11b. In this arrangement, of incident light, the multilayer interference filter 20b selectively conducts light in a wavelength range of blue (B) to the photoelectric conversion layer 11b. That is, the multilayer interference filter 20b functions as a color filter for blue (B). The multilayer interference filter 20b is formed of inorganic substances. The multilayer interference filter 20b includes, for example, a photonic crystal type laminate structure 29b, as a filter for red. In the filter, inorganic materials (low refraction index material and high refraction index material) are laminated.

Specifically, the multilayer interference filter 20b has the laminate structure 29b and a third layer 26b. The laminate structure 29b has an upper laminate structure 24b and a lower laminate structure 25b. The upper laminate structure 24b and the lower laminate structure 25b function as opposed mirrors with the reflection surfaces. At this time, the upper laminate structure 24b and the lower laminate structure 25b have a center wavelength (for example, 550 nm) corresponding to the center part of a visible region (for example, wavelength region between 400 nm and 700 nm). In the center wavelength, a reflection rate of the mirror reaches a peak. In the multilayer interference filter 20b, it may be regarded that the interference layer 23b (with thickness of "0") is virtually arranged at the interface of the upper laminate structure 24b and the lower laminate structure 25b, and causes interference (multi-beam interference) of light multiply-reflected on the reflection surface of the upper laminate structure 24b and the lower laminate structure 25b. That is, the multilayer interference filter 20b functions based on the same principle as that of the Fabry-Perot interferometer.

In the upper laminate structure 24b, first layers 21b-3 and 21b-4 and second layers 22b-3 and 22b-4 are alternately laminated, and have different refraction indexes. In the upper laminate structure 24b, for example, the first layer 21b-3, the second layer 22b-3, the first layer 21b-4, and the second layer 22b-4 are laminated sequentially in this order.

In the lower laminate structure 25b, first layers 21b-1 and 21b-2 and second layers 22b-1 and 22b-2 are alternately laminated, and have different refraction indexes. In the lower laminate structure 25b, for example, the second layer 22b-1, the first layer 21b-1, the second layer 22b-2, and the first layer 21b-2 are laminated sequentially in this order.

The refraction indexes of the first layers 21b-1, 21b-2, 21b-3, and 21b-4 are greater than those of the second layers 22b-1, 22b-2, 22b-3, and 22b-4. The first layers 21b-1, 21b-2, 21b-3, and 21b-4 are formed of a material including titanium oxide ($TiO_2$) as the main component, have a first refraction index n1 (for example, 2.5). The second layers 22b-1, 22b-2, 22b-3, and 22b-4 are formed of a material including silicon oxide ($SiO_2$) as the main component, and have a second refraction index n2 (for example, 1.46).

In the laminate structure 29b, the number of laminated layers of the upper laminate structure 24b is equal to the number of laminated layers of the lower laminate structure 25*b*, and is, for example, three. That is, in the laminate structure 29*b*, the number of layers except the interference layer 23*b* is six. Both of the lowermost layer (layer in contact with the upper surface of the interference layer 23*b*) of the upper laminate structure 24*b* and the uppermost layer (layer in contact with lower surface of the interference layer 23*b*) of the lower laminate structure 25*b* are the first layers (21*b*-3 and 21*b*-2).

In the laminate structure 29*b*, in the upper laminate structure 24*b* and the lower laminate structure 25*b*, a part of a plurality of layers in both structures is thinner than the rest of layers. That is, in the upper laminate structure 24*b* and the lower laminate structure 25*b*, two of the first layers 21*b*-2 and 21*b*-3 (for example, 20 nm to 45 nm) are thinner than the rest of the first layers 21*b*-1 and 21*b*-4 (for example, 50 nm to 60 nm), of the plurality of first layers 21*b*-1, 21*b*-2, 21*b*-3, and 21*b*-4. The rest of the first layers 21*b*-1 and 21*b*-4 have an equal thickness (for example, a thickness corresponding to an optical film thickness equal to one fourth of the center wavelength λ). In the upper laminate structure 24*b* and the lower laminate structure 25*b*, a plurality of second layers 22*b*-1, 22*b*-2, 22*b*-3, and 22*b*-4 have an equal thickness (for example, a thickness corresponding to an optical film thickness equal to one fourth of the center wavelength λ).

The third layer 26*b* is in contact with the lower side of a lower surface 29*b*1 of the laminate structure 29*b*. That is, the lowermost layer of the laminate structure 29*b* is the second layer 22*b*-1, and the third layer 26*b* is in contact with the lower surface of the second layer 22*b*-1. The third layer 26*b* is formed of a material including silicon nitride (SiN) as the main component, and has a third refraction index n3 (for example, 2.0).

The third refraction index n3 is not equal to the first refraction index n1, and is higher than the second refraction index n2. For example, when the second refraction index n2 is lower than the first refraction index n1, the third refraction index n3 (for example, 2.0) may be lower than the first refraction index n1 (for example, 2.5) and higher than the second refraction index n2 (for example, 1.46). As a result, of the incident light, color mixture components (light in a wavelength range except for blue (B)) can selectively be reflected and removed at the interface of the laminate structure 29*b* and the third layer 26*b*.

The planarizing layers 40*r*, 40*g*, and 40*b* cover respectively the multilayer filters 20*r*, 20*g*, and 20*b*. As a result, the planarizing layers 40*r*, 40*g*, and 40*b* ease a difference in level between the multilayer interference filters 20*r*, 20*g*, and 20*b*, thereby providing a planarized surface. The planarizing layers 40*r*, 40*g*, and 40*b* are formed of a predetermined resin or an oxide film (for example, SiO$_2$).

The micro lenses 50*r*, 50*g*, and 50*b* are arranged respectively above the planarizing layers 40*r*, 40*g*, and 40*b*. In this arrangement, the micro lenses 50*r*, 50*g*, and 50*b* focus the incident light onto the photoelectric conversion layers 11*r*, 11*g*, and 11*b* through the multilayer interference filters 20*r*, 20*g*, and 20*b*. The micro lenses 50*r*, 50*g*, and 50*b* are formed of a predetermined resin, for example.

In the multilayer interference filters 20*r*, 20*g*, and 20*b*, the transmission bandwidth is changed, in accordance with whether there is an interference layer at the interface of the upper laminate structure and the lower laminate structure and depending on a difference in the film thickness. For example, when there is no interference layer thereat, it may be assumed that an interference layer of "0" nm virtually exists. In this case, in the multilayer interference filters 20*r*, 20*g*, and 20*b*, if the interference layers have a thickness of 85 nm, 35 nm, and 0 nm, the spectral transmittance reaches peaks respectively in the wavelengths of red, green, and blue (see FIG. 2A and FIG. 2B).

An optical film thickness of the third layers 26*r*, 26*g*, and 26*b* in the respective multilayer interference filters 20*r*, 20*g*, and 20*b* is preferably in a range from 125 nm to 225 nm, more preferably in a range from 125 nm to 200 nm, still more preferably in a range from 125 nm to 175 nm, and yet still more preferably in a range from 125 nm to 150 nm. When the third layers 26*r*, 26*g*, and 26*b* are formed of a material including silicon nitride, the third refraction index is, for example, 2.0. Thus, the third layers 26*r*, 26*g*, and 26*b* preferably have a thickness equal to or lower than 112 nm, more preferably equal to or lower than 100 nm, still more preferably equal to or lower than 88 nm, and still more preferably equal to or lower than 75 nm.

For example, when an optical film thickness of the third layers 26*r*, 26*g*, and 26*b* is equal to lower than 225 nm (for example, when the third layers 26*r*, 26*g*, and 26*b* are formed of a material including silicon nitride as the main component, with a thickness equal to or lower than 112 nm), light in a wavelength bandwidth with the center wavelength equal to or lower than 900 nm can selectively be reflected and removed at the interface of the laminate structures 29*r*, 29*g*, and 29*b* and the third layers 26*r*, 26*g*, and 26*b*.

For example, when an optical film thickness of the third layers 26*r*, 26*g*, and 26*b* is equal to or lower than 200 nm (for example, when the third layers 26*r*, 26*g*, and 26*b* are formed of a material including silicon nitride as the main component, with a thickness equal to or lower than 100 nm), light in a wavelength bandwidth with the center wavelength equal to or lower than 800 nm can selectively be reflected at the interface of the laminate structures 29*r*, 29*g*, and 29*b* and the third layers 26*r*, 26*g*, and 26*b*, and be removed therefrom.

For example, when an optical film thickness of the third layers 26*r*, 26*g*, and 26*b* is equal to or lower than 175 nm (for example, when the third layers 26*r*, 26*g*, and 26*b* are formed of a material including silicon nitride as the main component, with a thickness equal to or lower than 88 nm), light in a wavelength bandwidth with the center wavelength equal to or lower than 700 nm can selectively be reflected at the interface of the laminate structures 29*r*, 29*g*, and 29*b* and the third layers 26*r*, 26*g*, and 26*b*, and be removed therefrom.

For example, when an optical film thickness of the third layers 26*r*, 26*g*, and 26*b* is equal to or lower than 150 nm (for example, when the third layers 26*r*, 26*g*, and 26*b* are formed of a material including silicon nitride as the main component, with a thickness equal to or lower than 75 nm), light in a wavelength bandwidth with the center wavelength equal to or lower than 600 nm can selectively be reflected and removed at the interface of the laminate structures 29*r*, 29*g*, and 29*b* and the third layers 26*r*, 26*g*, and 26*b*.

If the optical film thickness of the third layers 26*r*, 26*g*, and 26*b* in the multilayer interference filters 20*r*, 20*g*, and 20*b* is lower than 125 nm, the center wavelength for reflection becomes too short, thus resulting in difficulty of eliminating cross talk on the side of the long wavelength. Alternatively, if the optical film thickness of the third layers 26*r*, 26*g*, and 26*b* in the multilayer interference filters 20*r*, 20*g*, and 20*b* is greater than 225 nm, the center wavelength for reflection becomes too long, thus resulting in difficulty of eliminating cross talk on the side of the long wavelength.

When compared with a film of silicon nitride used in a passivation film in the solid-state image sensor, the third layers 26*r*, 26*g*, and 26*b* are thinner than the silicon nitride film (for example, optical film thickness: 250 nm or greater, thickness: 125 nm or greater) used for the passivation film. In the film of silicon nitride for use in the passivation film, the optical film thickness is made equal to or greater than 250 nm, for eliminating light reflection in the visible region at the interface with the silicon oxide film. The film density of the third layers 26r, 26g, and 26b is lower than that of the silicon nitride film for use in the passivation film. In the silicon nitride film for use in the passivation film, in many cases, the film density is adjusted to be high, for eliminating light reflection in the visible region at the interface with the silicon oxide film. Further, the oxygen concentration of the third layers 26r, 26g, and 26b is lower than that of the silicon nitride film for use in the passivation film. In the silicon nitride film for use in the passivation film, in many cases, the oxygen concentration is adjusted to be high, for eliminating light reflection in the visible region at the interface with the silicon oxide film.

In the laminate structures 29r, 29g, and 29b of the respective multilayer interference filters 20r, 20g, and 20b, in both of the upper laminate structure and the lower laminate structure, of a plurality of first layers 21r-1, 21r-2, 21r-3, and 21r-4, two of the first layers 21r-2 and 21r-3 (for example, 20 nm to 45 nm) are thinner than the rest of the first layers 21r-1 and 21r-4 (for example, 50 nm to 60 nm). At this time, the two first layers 21r-2 and 21r-3 may have an equal thickness. That is, the upper laminate structure and the lower laminate structure may have symmetrical structures with each other at the interface of the upper laminate structure and the lower laminate structure.

Descriptions will now be made to the solid-state image sensor according to the first embodiment, using FIGS. 3, 4, and 1. FIG. 3A to FIG. 3C, FIG. 4A, FIG. 4B, and FIG. 5A and FIG. 5B are process cross sectional views each illustrating a method for manufacturing the solid-state image sensor 1 according to the first embodiment. FIG. 1 is applied as a process cross sectional view, following FIG. 5.

Figure 3A:
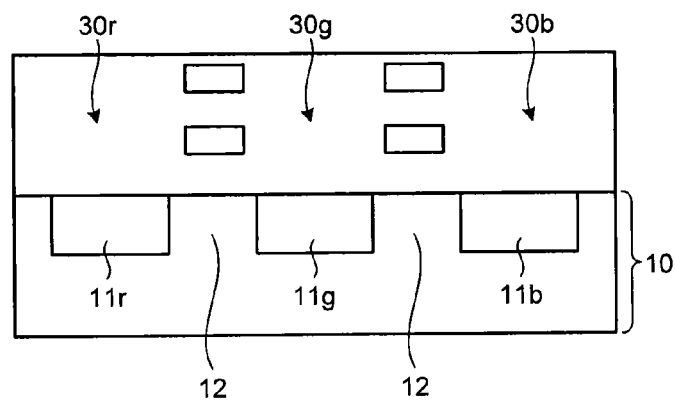
FIG. 3A to FIG. 3C are diagrams each illustrating a method for manufacturing the solid-state image sensor according to the first embodiment.

In the process illustrated in FIG. 3A, in the well region 12 of the semiconductor substrate 10, the photoelectric conversion layers 11r, 11g, and 11b respectively including charge accumulation regions are formed, using an ion implantation technique. The well region 12 is formed with a semiconductor (for example, silicon) including first conductive (for example, P-type) impurities at a low concentration. The charge accumulation region of each of the photoelectric conversion layers 11r, 11g, and 11b is formed by implanting second conductive type (for example, N-type) impurities as opposite conductive type from the first conductive type impurities, into the well region 12 of the semiconductor substrate 10, at a concentration higher than the concentration of the first conductive impurities in the well region 12.

An interlayer insulating film covering the semiconductor substrate 10 is formed by accumulating, for example, $SiO_2$ using a CVD technique. A wiring pattern is formed of metal on the interlayer insulating film using a sputtering technique or a lithography technique, and the interlayer insulating film and the interlayer insulating film covering the wiring pattern are formed of, for example, $SiO_2$ using a CVD technique. These formation processes are repeated. This results in forming multilayer wiring structures 30r, 30g, and 30b.

Figure 3B:
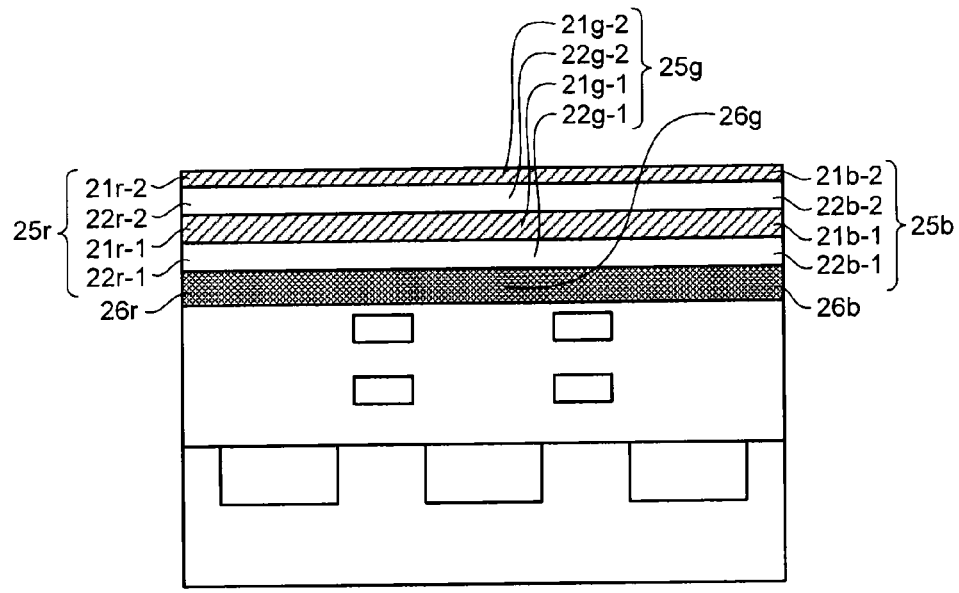

In the process illustrated in FIG. 3B, the third layers 26r, 26g, and 26b are simultaneously accumulated and formed on the multilayer wiring structures 30r, 30g, and 30b. The third layers are to be in contact with the lower surface of the laminate structures 29r, 29g, and 29b of the interlayer interference filters 20r, 20g, and 20b. The third layers 26r, 26g, and 26b are formed of a material including, for example, silicon nitride as the main component using a CVD technique. The third layers 26r, 26g, and 26b are formed to have an optical film thickness $(=(1/4)\times\lambda f)$ in a range approximately 100 nm to 200 nm. When the refraction index of a material (for example, SiN) is "n3", and when the center wavelength for reflection is "$\lambda f$", the third layers 26r, 26g, and 26b are formed using a film thickness d3 which satisfies Equation 1.

$$n3 \times d3 = (1/4) \times \lambda f \qquad \text{Equation 1}$$

For example, if "n3=2.3" and "$\lambda f$=900 nm" are substituted in Equation 1, d3=112 nm. For example, if "n3=2.0" and "$\lambda f$=800" are substituted in Equation 1, d3=100 nm. For example, if "n3=2.0" and "$\lambda f$=700 nm" are substituted in Equation 1, d3=88 nm. For example, if "n3=2.0" and "$\lambda f$=600 nm" are substituted in Equation 1, d3=75 nm.

The lower laminate structures 25r, 25g, and 25b are formed to be in the lower part of the laminate structures 29r, 29g, and 29b. Specifically, the second layers 22r-1, 22g-1, and 22b-1 are simultaneously accumulated, the first layers 21r-1, 21g-1, and 21b-1 are simultaneously accumulated, the second layers 22r-1, 22g-1, and 22b-1 are simultaneously accumulated, and the first layers 21r-2, 21g-2, and 21b-2 are simultaneously accumulated. These accumulation processes are sequentially performed. Each of the first layers 21r-1 to 21b-2 is formed of a material including titanium oxide ($TiO_2$) as the main component, using a sputtering technique. Each of the second layers 22r-1 to 22b-2 is formed of a material including, for example, silicon oxide ($SiO_2$), using a CVD technique.

The second layers 22r-1, 22g-1, and 22b-1 are formed to have an optical film thickness (for example, 80 nm to 90 nm) which is approximately one fourth of the center wavelength (for example, 550 nm) of the multilayer interference filter. For example, if the refraction index of a material (for example, $SiO_2$) is n2, and if the center wavelength of the multilayer interference filter is $\lambda$, the second layers 22r-1, 22g-1, and 22b-1 are formed with a film thickness d2 which satisfies Equation 2.

$$n2 \times d2 = (1/4) \times \lambda \qquad \text{Equation 2}$$

For example, if "n2=1.46" and "$\lambda$=550 nm" are substituted in Equation 2, d2=94 nm.

The first layers 21r-1, 21g-2, and 21b-1 are formed to have an optical film thickness (for example, 50 nm to 60 nm) which is approximately one fourth of the center wavelength (for example, 550 nm) of the multilayer interference filter. For example, if the refraction index of the material (for example, $TiO_2$) is n1, and if the center wavelength of the multilayer interference filter is $\lambda$, the first layer 21r-1, 21g-1, and 21b-1 are formed with a film thickness d1 which satisfies Equation 3.

$$n1 \times d1 = (1/4) \times \lambda \qquad \text{Equation 3}$$

For example, if "n1=2.5" and "$\lambda$=550 nm" are substituted in Equation 3, d1=55 nm.

The second layers 22r-2, 22g-2, and 22b-2 are formed to have an optical film thickness (for example, 80 nm to 90 nm) which is approximately one fourth of the center wavelength (for example, 550 nm) of the multilayer interference filter. For example, if the refraction index of the material (for example, $SiO_2$) is n2, and if the center wavelength of the multilayer interference filter is $\lambda$, the second layers 22r-2, 22g-2, and 22b-2 are formed with a film thickness d2 which satisfies Equation 2.

The first layers 21r-1, 21g-1, and 21b-1 are formed to have an optical film thickness (for example, 30 nm to 45 nm) which is approximately equal to or thinner than one fourth of the center wavelength (for example, 550 nm) of the multilayer interference filter. For example, if the refraction index of a material (for example, $TiO_2$) is n1, and the center wavelength of the multilayer interference filter is $\lambda$, the first layers 21r-2, 21g-2, and 21b-2 are formed with a film thickness which is thinner than the film thickness d1 satisfying Equation 3.

As a result, the lower laminate structure 25r is formed. In this structure 25, the second layer 22r-1, the first layer 21r-1, the second layer 22r-2, and the first layer 21r-2 are laminated sequentially in this order. The lower laminate structure 25g is also formed. In this structure 25g, the second layer 22g-1, the first layer 21g-1, the second layer 22g-2, and the first layer 21g-2 are laminated sequentially in this order. The lower laminate structure 25b is formed. In this structure 25b, the second layer 22b-1, the first layer 21b-1, the second layer 22b-2, and the first layer 21b-2 are laminated sequentially in this order.

Figure 3C:
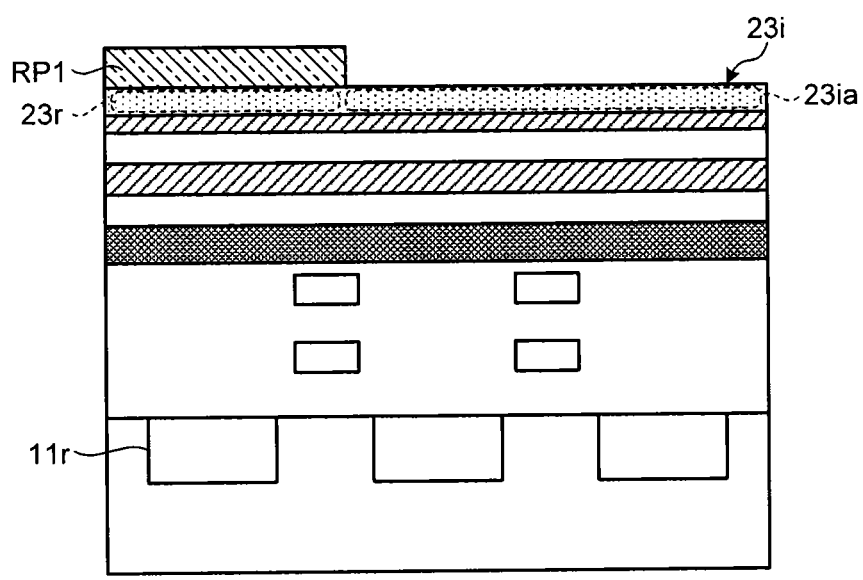

In the process illustrated in FIG. 3C, a layer 23i to be the interference layers 23r and 23g is formed on the first layers 21r-1, 21g-1, and 21b-1, using a CVD technique. This layer 23i is formed with a thickness (for example, 85 nm) corresponding to a wavelength range of red. A resist pattern RP1 is formed using a lithography technique. This pattern RP1 covers a part (interference layer 23r) corresponding to the upper part of the photoelectric conversion layer 11r in the layer 23i. At this time, a part 23ia corresponding to the upper part of the photoelectric conversion layers 11g and 11b, in the layer 23i, is exposed.

Figure 4A:
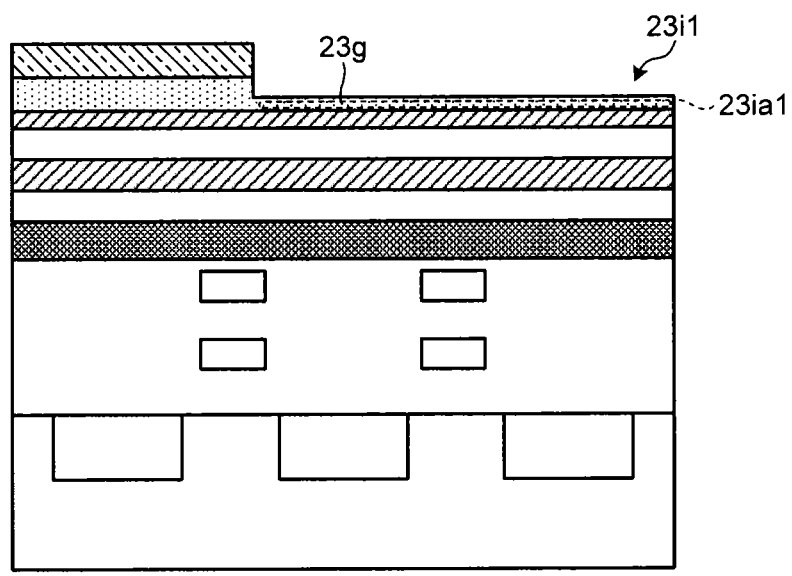
FIG. 4A and FIG. 4B are diagrams each illustrating a method for manufacturing the solid-state image sensor according to the first embodiment.

In the process illustrated in FIG. 4A, a part 23ia1, corresponding to the upper part of the photoelectric conversion layers 11g and 11b in a layer 23I1, is etched (half etched) and thinned up to a film thickness (for example, 35 nm) corresponding to a wavelength range of green, using a resist pattern RP1 as a mask. This results in forming the interference layer 23g in a part corresponding to the photoelectric conversion layer 11g. After this, the resist pattern RP1 is removed therefrom.

Figure 4B:
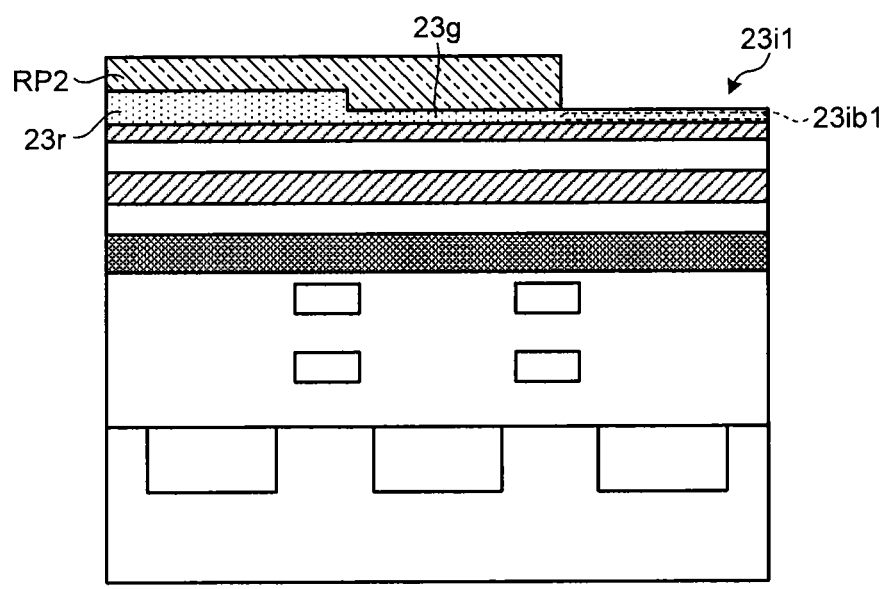

In the process illustrated in FIG. 4B, a resist pattern RP2 is formed using a lithography technique. This pattern RP2 covers a part (the interference layers 23r and 23g) corresponding to the upper part of the photoelectric conversion layers 11r and 11g in the layer 23i1. At this time, a part 23ib1 corresponding to the upper part of the photoelectric conversion layer 11b in the layer 23i1 is exposed.

Figure 5A:
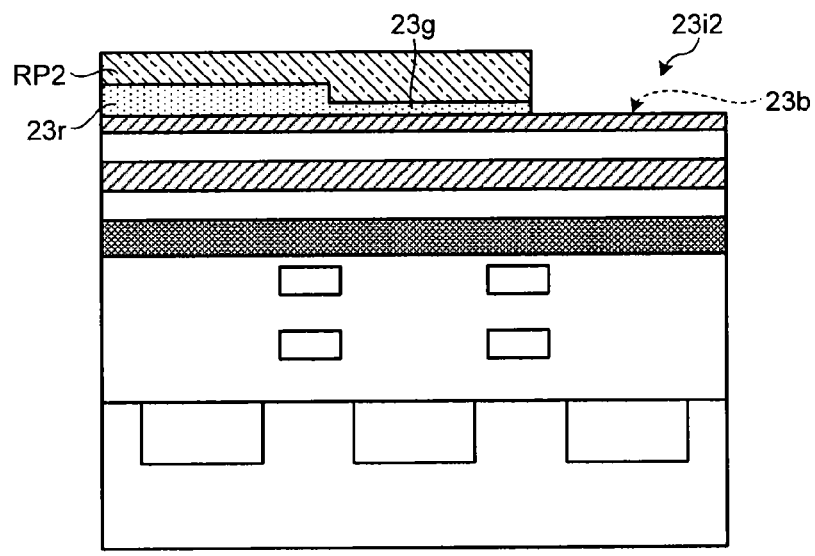
FIG. 5A and FIG. 5B are diagrams each illustrating a method for manufacturing the solid-state image sensor according to the first embodiment.

In the process illustrated in FIG. 5A, the part 23ib1, corresponding to the upper part of the photoelectric conversion layer 11b in the layer 23i1, is etched and removed therefrom, using a dry etching technique with the resist pattern RP2 as a mask. As a result, in a layer 23i2, the virtual interference layer 23b with a film thickness of "0 nm" is formed in a part corresponding to the photoelectric conversion layer 11b, while remaining the interference layers 23r and 23g. After this, the resist pattern RP2 is removed.

Figure 5B:
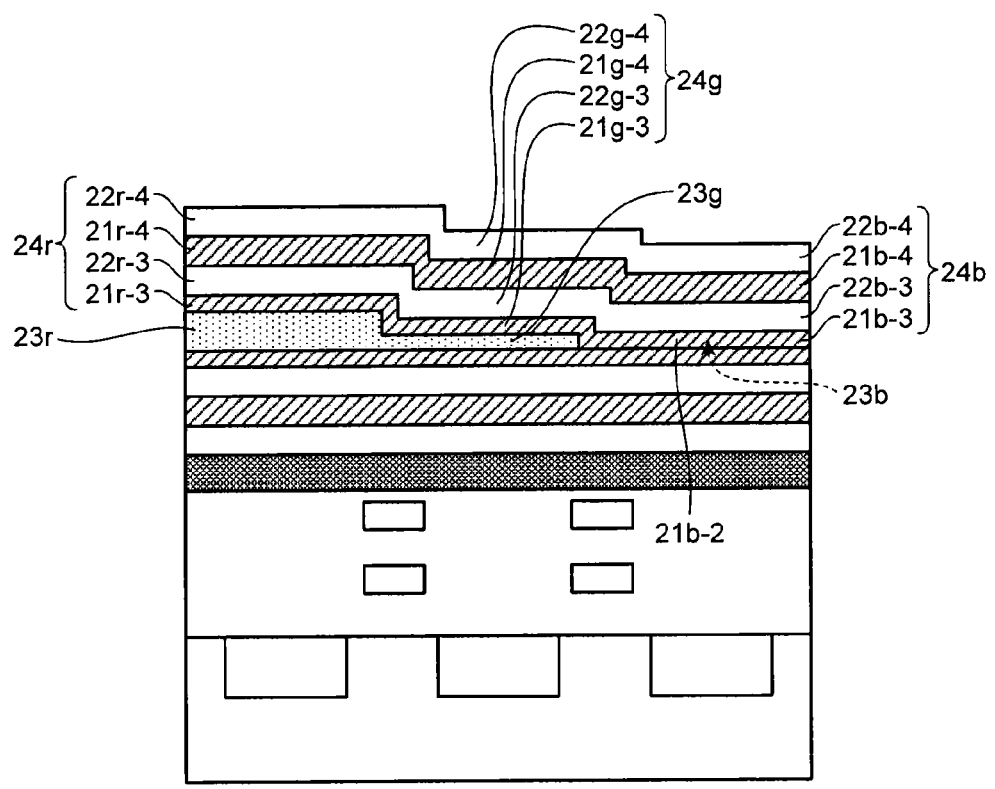

In the process illustrated in FIG. 5B, the upper laminate structures 24r, 24g, and 24b are formed. These structures 24r, 24g, and 25b are to be the upper parts of the laminate structures 29r, 20g, and 29b in the multilayer interference filters 20r, 20g, and 20b. Specifically, the first layers 21r-3, 21g-3, and 21b-3 are simultaneously accumulated, the second layers 22r-3, 22g-3, and 22b-3 are simultaneously accumulated, the first layers 21r-4, 21g-4, and 21b-4 are simultaneously accumulated, and the second layers 22r-4, 22g-4, and 22b-4 are simultaneously accumulated. These accumulation processes are sequentially performed. Each of the first layers 21r-3 to 21b-4 is formed of a material including, for example, titanium oxide ($TiO_2$) as the main component, using a sputtering technique. Each of the second layers 22r-3 to 22b-4 is formed of a material including silicon oxide ($SiO_2$) as the main component, using a CVD technique.

Each of the first layers 21r-3, 21g-3, and 21b-3 is formed with an optical film thickness (for example, 30 nm to 45 nm) which is thinner than one fourth of the center wavelength (for example, 550 nm) of the multilayer interference filter. For example, when the refraction index of a material (for example, $TiO_2$) is n1, and when the center wavelength of the multilayer interference filter is λ, the first layers 21r-2, 21g-2, and 21b-2 are formed with a film thickness (for example, film thickness thinner than 55 nm) thinner than the film thickness d1 which satisfies Equation 3.

The second layers 22r-3, 22g-3, and 22b-3 are formed with an optical film thickness (for example, 80 nm to 90 nm) which is equal to approximately one fourth of the center wavelength (for example, 550 nm) of the multilayer interference filter. For example, when the refraction index of a material (for example, $SiO_2$) is n2, and when the center wavelength of the multilayer interference filter is λ, the second layers 22r-3, 22g-3, and 22b-3 are formed with a film thickness d2 (for example, d2=94 nm) which satisfies Equation 2.

The first layers 21r-4, 21g-4, and 21b-4 are formed with an optical film thickness (for example, 50 nm to 60 nm) which is approximately one fourth of the center wavelength (for example, 550 nm) of the multilayer interference filter. For example, when the refraction index of a material (for example, $TiO_2$) is n1, and when the center wavelength of the multilayer interference filter is λ, the first layers 21r-4, 21g-4, and 21b-4 are formed with the film thickness d1 (for example, d1=55 nm) which satisfies Equation 3.

The second layers 22r-4, 22g-4, and 22b-4 are formed with an optical film thickness (for example, 80 nm to 90 nm) which is approximately one fourth of the center wavelength (for example, 550 nm) of the multilayer interference filter. For example, when the refraction index of a material (for example, $SiO_2$) is n2, and when the center wavelength of the multilayer interference filter is λ, the second layers 22r-4, 22g-4, and 22b-4 are formed with the film thickness d2 (for example, d2=94 nm) which satisfies Equation 2.

As a result, the upper laminate structure 24r is formed on the interference layer 23r. In the upper laminate structure 24r, the first layer 21r-3, the second layer 22r-3, the first layer 21r-4, and the second layer 22r-4 are laminated sequentially in this order. That is, the multilayer interference filter 20r having the third layer 26r and the laminate structure 29r is formed (see FIG. 1). The upper laminate structure 24g is formed on the interference layer 23g. In the structure 24g, the first layer 21g-3, the second layer 22g-3, the first layer 21g-4, and the second layer 22g-4 are laminated sequentially in this order. That is, the multilayer interference filter 20g having the third layer 26g and the laminate structure 29 is formed (see FIG. 1). The upper laminate structure 24b is formed on the first layer 21b-2 (that is, on the virtual interference layer 23b with a film thickness of "0 nm"). In the structure 24b, the first layer 21b-3, the second layer 22b-3, the first layer 21b-4, and the second layer 22b-4 are laminated sequentially in this order. That is, the multilayer interference filter 20b having the third layer 26b and the laminate structure 29b is formed (see FIG. 1).

In the process illustrated in FIG. 1, a film covering the multilayer interference filters 20r, 20g, and 20b is formed by accumulating a predetermined resin or oxide film ($SiO_2$), and the surface of the formed film is planarized using a CMP technique. This results in forming the planarizing layers 40r, 40g, and 40b having the planarized surface. The micro lenses 50r, 50g, and 50b are formed of a predetermined resin on the planarizing layers 40r, 40g, and 40b.

Accordingly, there is formed the solid-state image sensor 1 including the multilayer interference filters 20r, 20g, and 20b. The filters have a configuration in which the third layer is in contact with the lower side of the lower surface of the laminate structure in which the first layer and the second are repeatedly laminated.

Figure 2A:
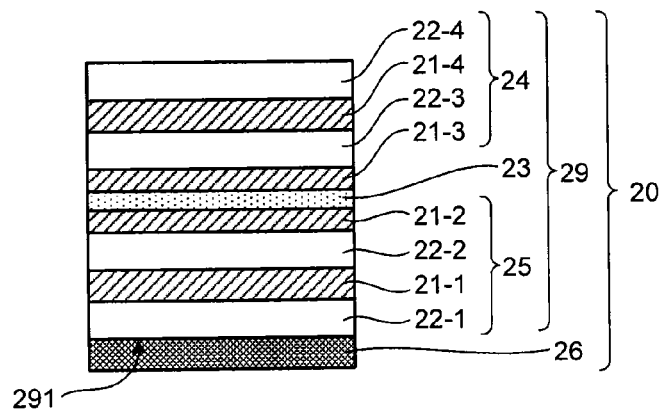
FIG. 2A and FIG. 2B are diagrams illustrating a configuration and characteristics of a multilayer interference filter according to the first embodiment.
Figure 15A:
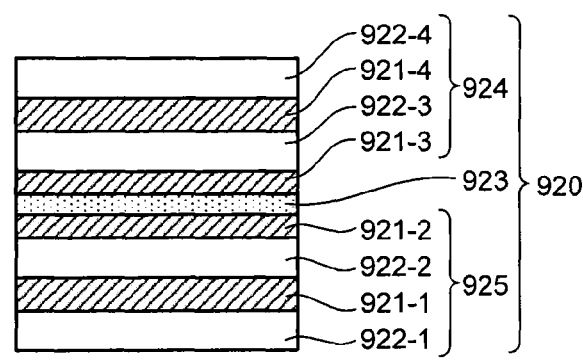
FIG. 15A and FIG. 15B are diagrams each illustrating a comparative example.
Figure 15B:
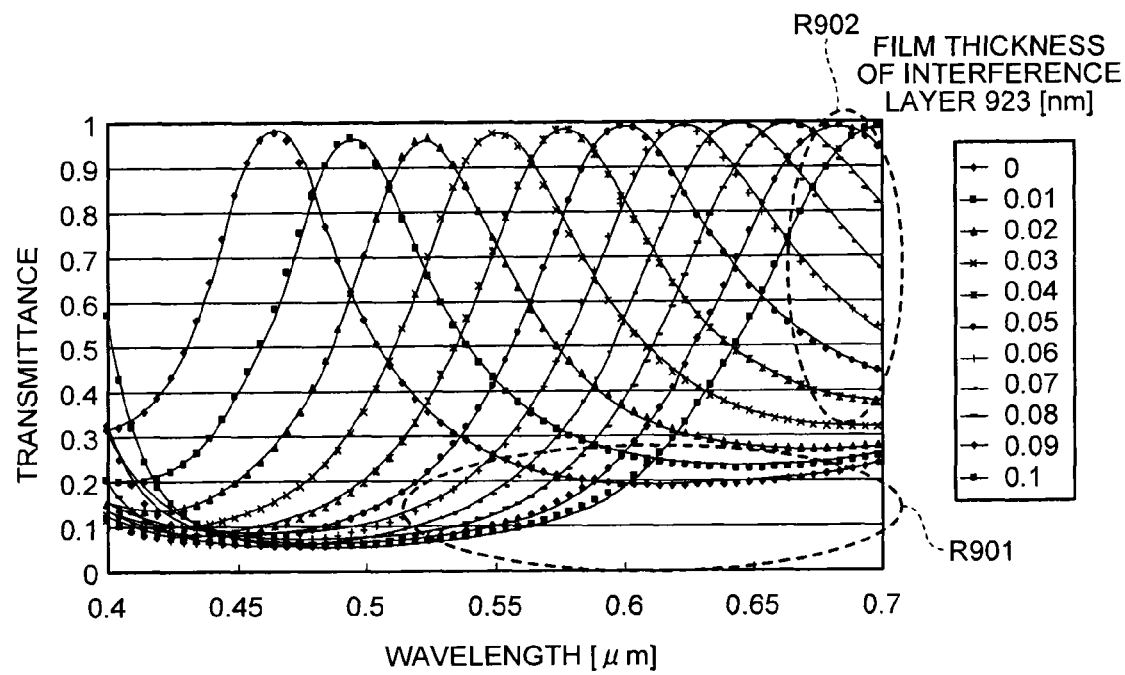

Let it be supposed that, as illustrated in FIG. 15A, a multilayer interference filter 920 included in the solid-state image sensor does not have the third layer 26 (see FIG. 2A). In this case, there is a tendency that light having a cross talk (color mixture) component on the side of the long wavelength penetrates down. For example, as illustrated in ranges R901 and R902 of FIG. 15B, the cross talk (color mixture) tends to increase on the side of the long wavelength (for example, 600 nm to 800 nm).

On the contrary, in the first embodiment, the multilayer interference filter 20 included in the solid-state image sensor 1 has the third layer 26. That is, as illustrated in FIG. 2A, in the multilayer interference filter 20, the third layer 26 is in contact with the lower side of a lower surface 291 of the laminate structure 29. At this time, the lowermost layer of the laminate structure 29 is the second layer 22-1, and the refraction index n3 of the third layer 26 is greater than the refraction index n2 of the second layer 22-1. Thus, a cross talk (color mixture) component of the incident light can be selectively reflected and removed at the interface of the laminate structure 29 and the third layer 26. As a result, as illustrated in the ranges R1 and R2 of FIG. 2B, it is possible to easily eliminate the cross talk (color mixture) on the side of the long wavelength (for example, 600 nm to 800 nm). That is, the cross talk (color mixture) can be improved.

In the first embodiment, for example, the third layer 26 (see FIG. 2A) in the multilayer interference filter 20 has an optical film thickness which is equal to or lower than 225 nm. In this case, light in a wavelength bandwidth with a center wavelength of 900 nm or lower can selectively be selected and removed at the interface of the laminate structure 29 and the third layer 26. As a result, the cross talk (color mixture) on the side of the long wavelength (for example, 600 nm to 900 nm) can easily be lowered.

In the first embodiment, for example, the third layer 26 of the multilayer interference filter 20 has an optical film thickness of 200 nm or lower. In this case, light in a wavelength bandwidth with a center wavelength of 800 nm or lower can selectively be reflected and removed at the interface of the laminate structure 29 and the third layer 26. As a result, the cross talk (color mixture) on the side of the long wavelength (for example, 600 nm to 900 nm) can easily be lowered.

Alternatively, in the first embodiment, for example, the third layer 26 in the multilayer interference filter 20 has an optical film thickness of 175 nm or lower. In this case, light in a wavelength bandwidth with a center wavelength of 700 nm or lower can selectively be reflected and removed at the interface of the laminate structure 29 and the third layer 26. As a result, the cross talk (color mixture) on the side of the long wavelength (for example, 600 nm to 900 nm) can easily be lowered.

Alternatively, in the first embodiment, the third layer 26 in the multilayer interference filter 20 has an optical film thickness of 150 nm. In this case, light in a wavelength bandwidth with a center wavelength of 600 nm or lower can selectively be reflected and removed at the interface of the laminate structure 29 and the third layer 26. As a result, the cross talk (color mixture) on the side of the long wavelength (for example, 600 nm to 900 nm) can easily be lowered.

In the first embodiment, for example, the third layer 26 in the multilayer interference filter 20 is formed of a material including silicon nitride as the main component, and the third layer 26 has a film thickness of 112 nm or thinner. In this case, light in a wavelength bandwidth with a center wavelength of 900 nm or lower can selectively be reflected and removed at the interface of the laminate structure 29 and the third layer 26. As a result, the cross talk (color mixture) on the side of the long wavelength (for example, 600 nm to 900 nm) can easily be lowered.

Alternatively, in the first embodiment, the third layer 26 in the multilayer interference filter 20 is formed of a material including silicon nitride as the main component, and the third layer 26 has a film thickness of 100 nm or thinner. In this case, light in a wavelength bandwidth with a center wavelength of 800 nm or lower can selectively be reflected and removed at the interface of the laminate structure 29 and the third layer 26. As a result, the cross talk (color mixture) on the side of the long wavelength (for example, 600 nm to 900 nm) can easily be lowered.

Alternatively, in the first embodiment, for example, the third layer 26 in the multilayer interference filter 20 is formed of a material including silicon nitride as the main component, and the third layer 26 has a film thickness of 88 nm or thinner. In this case, light in a wavelength bandwidth with a center wavelength of 700 nm or lower can selectively be reflected and removed at the interface of the laminate structure 29 and the third layer 26. As a result, the cross talk (color mixture) on the side of the long wavelength (for example, 600 nm to 900 nm) can easily be lowered.

In the first embodiment, for example, the third layer 26 in the multilayer interference filter 20 is formed of a material including silicon nitride as the main component, and the third layer 26 has a film thickness of 75 nm or thinner. In this case, light in a wavelength bandwidth with a center wavelength of 600 nm or lower can selectively be reflected at the interface of the laminate structure 29 and the third layer 26. As a result, the cross talk (color mixture) on the side of the long wavelength (for example, 600 nm to 900 nm) can easily be lowered.

In the first embodiment, the refraction index $n2$ of the second layer is lower than the refraction index $n1$ of the first layer. The refraction index $n3$ of the third layer is lower than the refraction index $n1$ of the first layer and higher than the refraction index $n2$ of the second layer. As a result, it is possible to apply the silicon nitride film which can be formed with the above-described thickness, as the third layer.

In the first embodiment, in the upper laminate structure and the lower laminate structure, of the plurality of first layers 21r-1, 21r-2, 21r-3, and 21r-4, both of the first layers 21r-2 and 21r-3 (for example, 20 nm to 45 nm) are thinner than the rest two first layers 21r-1 and 21r-4 (for example, 50 nm to 60 nm). At this time, the two first layers 21r-2 and 21r-3 have an equal thickness. That is, the upper laminate structure and the lower laminate structure have symmetrical structures with each other at the interface of the upper laminate structure and the lower laminate structure.

In this configuration, if the interference layer 23 have a thickness of 0 nm, 35 nm, and 85 nm, the spectral transmittance reaches peaks respectively in the wavelengths of blue (B), green (G), and red (R). That is, if the interference layer 23 is not provided (that is, if a virtual thickness of 0 nm is given), the spectral transmittance of the multilayer interference filter 20 reaches a primary peak in the wavelength of blue (B). Accordingly, when the spectral transmittance reaches a peak on the side of the shorter wavelength than the center wavelength, the primary peak may be applied as the spectral transmittance, thus realizing a wide spectral width of the transmittance. As a result, in the solid-state image sensor 1, the photoelectric conversion layer corresponding to the multilayer interference filter of a color (for example, blue) on the side of the shorter wavelength than the center wavelength can receive a sufficient amount of light for a required sensitivity level, thus improving the sensitivity. That is, it is possible to improve the sensitivity of the photoelectric conversion layer corresponding to the multilayer interference filter of a color (for example, blue) on the side of the shorter wavelength than the center wavelength.

The third layer 26 in each multilayer interference filter 20 may be formed of any film material (for example, HfO), as long as the film material can easily be formed relatively thick. At this time, this film material has a refraction index higher than that of the lowermost layer of the laminate structure 29 (that is, the second layer 22-1 (for example, $SiO_2$)).

In the laminate structure 29 (see FIG. 2A) of each multilayer interference filter 20, the upper laminate structure and the lower laminate structure may have symmetrical structures with each other at the interface of the upper laminate structure and the lower laminate structure.

For example, in the laminate structure 29 of each multilayer interference filter 20, in the upper laminate structure and the lower laminate structure, of a plurality of first layers 21-1, 21-2, 21-3, and 21-4, two or more first layers may be thinner than the rest of the first layers.

For example, the film thickness may satisfy an inequality of "film thickness of the lowermost first layer 21-3 in the upper laminate structure"<"film thickness of the uppermost first layer 21-2 in the lower laminate structure"<"film thickness of each of the rest of the first layers 21-1 and 21-4 in both of the upper laminate structure and the lower laminate structure". Alternatively, for example, the film thickness may satisfy and an inequality of "film thickness of the uppermost first layer 21-2 in the lower laminate structure"<"film thickness of the lowermost first layer 21-3 in the upper laminate structure"<"film thickness of the rest of the first layers 21-1 and 21-4 in both of the upper laminate structure and the lower laminate structure".

For example, in the laminate structure 29 of each multilayer interference filter 20, in the upper laminate structure and the lower laminate structure, of the plurality of first layers 21-1, 21-2, 21-3, and 21-4, only the first layer 21r-3 (for example, 20 nm to 45 nm) may be thinner than the rest of the first layers 21-1, 21-2, and 21-4 (for example, 50 nm to 60 nm).

Figure 2B:
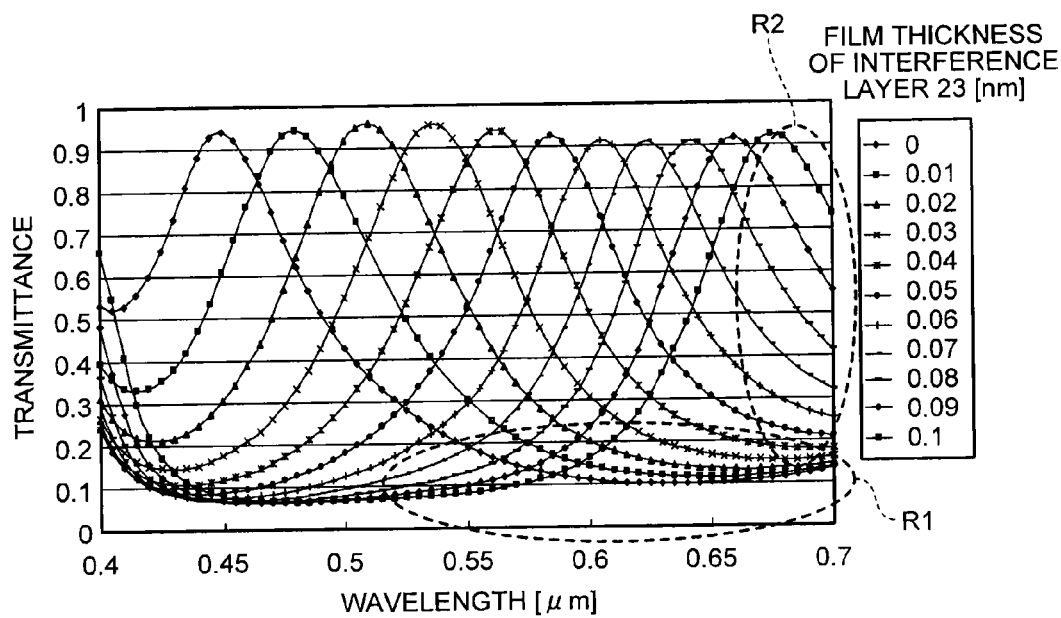

Also in this configuration, if the interference layer 23 has a thickness of 0 nm, 35 nm, and 85 nm, as illustrated in FIG. 2B, the spectral transmittance reaches primary peaks respectively in the wavelengths of blue (B), green (G), and red (R). That is, if the interference layer 23 is not provided (that is, if a virtual thickness of 0 nm is given), the primary peak of the spectral transmittance of the multilayer interference filter 20 appears in the wavelength bandwidth of blue (B). Accordingly, when the spectral transmittance reaches a peak on the side of the shorter wavelength than the center wavelength, the primary peak may be applied as the peak of the spectral transmittance, thus realizing a wide spectral width of the transmittance. As a result, in the solid-state image sensor 1, the photoelectric conversion layer corresponding to the multilayer interference filter of a color (for example, blue) on the side of the shorter wavelength than the center wavelength can receive a sufficient amount of light for a required sensitivity level, thus improving the sensitivity. That is, it is possible to improve the sensitivity of the photoelectric conversion layer corresponding to the multilayer interference filter of a color (for example, blue) on the side of the shorter wavelength than the center wavelength.

In the laminate structure 29 of each multilayer interference filter 20, in both of the upper laminate structure and the lower laminate structure, of the plurality of first layers 21-1, 21-2, 21-3, and 21-4, only the first layer 21r-2 (for example, 20 nm to 45 nm) may be thinner than the rest of the first layers 21-1, 21-3, and 21-4 (for example, 50 nm to 60 nm).

In this configuration, if the interference layer 23 has a thickness of 0 nm, 35 nm, and 85 nm, the spectral transmittance reaches primary peaks respectively in the wavelengths of blue (B), green (G), and red (R). That is, if the interference layer 23 is not provided (that is, if a virtual thickness of 0 nm is given), the primary peak of the spectral transmittance of the multilayer interference filter 20 appears in the wavelength bandwidth of blue (B). Accordingly, when the spectral transmittance has a peak on the side of the shorter wavelength than the center wavelength, the primary peak may be applied as the peak of the spectral transmittance, thus realizing a wide spectral width of the transmittance. As a result, in the solid-state image sensor 1, the photoelectric conversion layer corresponding to the multilayer interference filter of a color (for example, blue) on the side of the shorter wavelength than the center wavelength can receive a sufficient amount of light for a required sensitivity level, thus improving the sensitivity. That is, it is possible to improve the sensitivity of the photoelectric conversion layer corresponding to the multilayer interference filter of a color (for example, blue) on the side of the shorter wavelength than the center wavelength.

Figure 6:
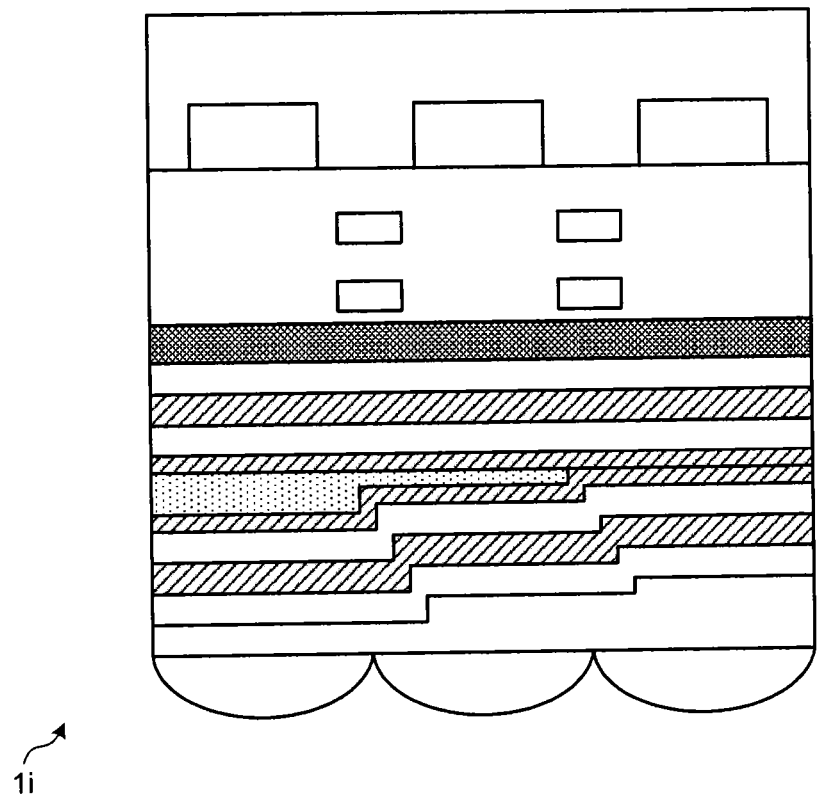
FIG. 6 is a diagram illustrating a configuration of a solid-state image sensor according to a modification of the first embodiment.

In the first embodiment, the descriptions have exemplarily been made to the front-side illuminated solid-state image sensor. The idea of the first embodiment is applicable to a backside illuminated solid-state image sensor. In this case, from and after the process of FIG. 3A, after the back side of the semiconductor substrate 10 is polished, the same layer formed in the processes from and after the process of FIG. 3B is formed for the polished back-side, thereby obtaining a back-side illuminated solid-state image sensor 1i illustrated in FIG. 6.

Second Embodiment

Descriptions will now be made to a solid-state image sensor 100 according to a second embodiment. The descriptions will hereinafter be made mainly to those parts different from that of the first embodiment.

In the first embodiment, to lower the cross talk up to the infrared side (infrared or near infrared) for the spectrum of the long wavelength, the third layers 26r, 26g, and 26b have an equal film thickness in the multilayer interference filters 20r, 20g, and 20b of red (R), green (G), and blue (B).

In the second embodiment, based on a consideration of a case in which infrared cutting is not necessary on the infrared side, the third layer 26 (see FIG. 1) is not provided in a multilayer interference filter 120r of red (R).

Figure 7:
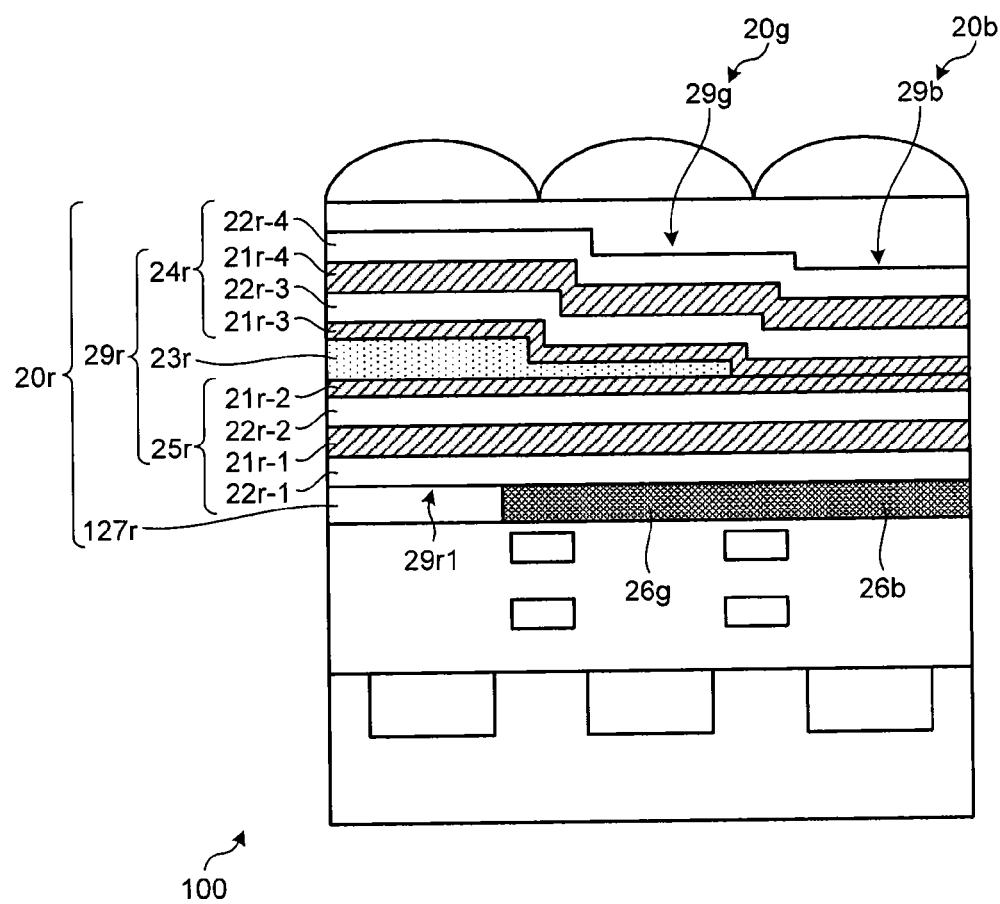
FIG. 7 is a diagram illustrating a configuration of a solid-state image sensor according to a second embodiment.

Specifically, as illustrated in FIG. 7, in the solid-state image sensor 100, the multilayer interference filter 120r of red (R) has a fourth layer 127r in place of the third layer 26r (see FIG. 1).

The fourth layer 127 is in contact with the lower surface 29r1 of the laminate structure 29r. That is, the lowermost layer of the laminate structure 29r is the second layer 22r-1, and the fourth layer 127r is in contact with the lower surface of the second layer 22r-1. The fourth layer 127r is formed of a material including, for example, silicon oxide ($SiO_2$) as the main component, and has a fourth refraction index n4 (for example 1.46). The fourth refraction index n4 is not equal to the first refraction index n1, and is equal to the second refraction index n2. As a result, light in a wavelength bandwidth of red (R) penetrated through the laminate structure 29r can penetrate down as is.

That is, in the solid-state image sensor 100, the third layers 26g and 26b and the fourth layer 127r are provided with an equal film thickness. The third layers 26g and 26b have a higher refraction index than that of the uppermost layer (the second layer, for example, SiO$_2$) of the laminate structures 29g and 29b in the multilayer interference filter 20g of green (G) and the multilayer interference filter 20b of blue (B). The fourth layer 127r has a refraction index equal to that of the lowermost layer (second layer, for example, SiO$_2$) of the laminate structure 29r in the multilayer interference filter 120r of red (R).

Figure 8A:
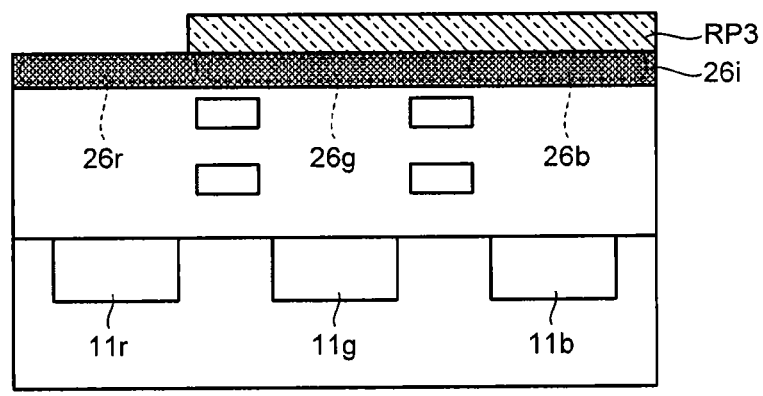
FIG. 8A to FIG. 8C are diagrams each illustrating a method for manufacturing the solid-state image sensor according to the second embodiment.
Figure 8B:
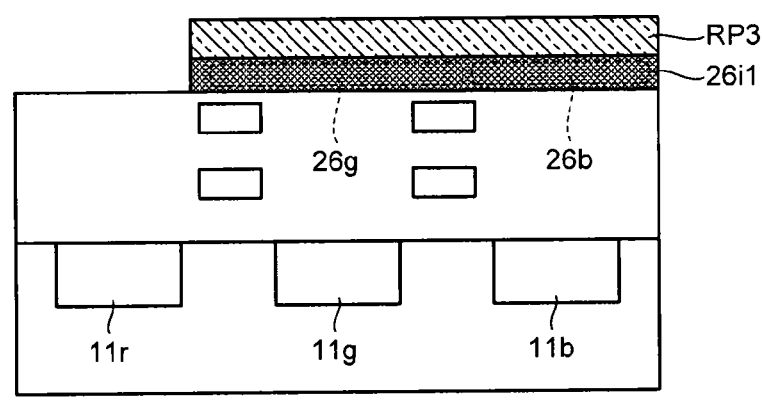
Figure 8C:
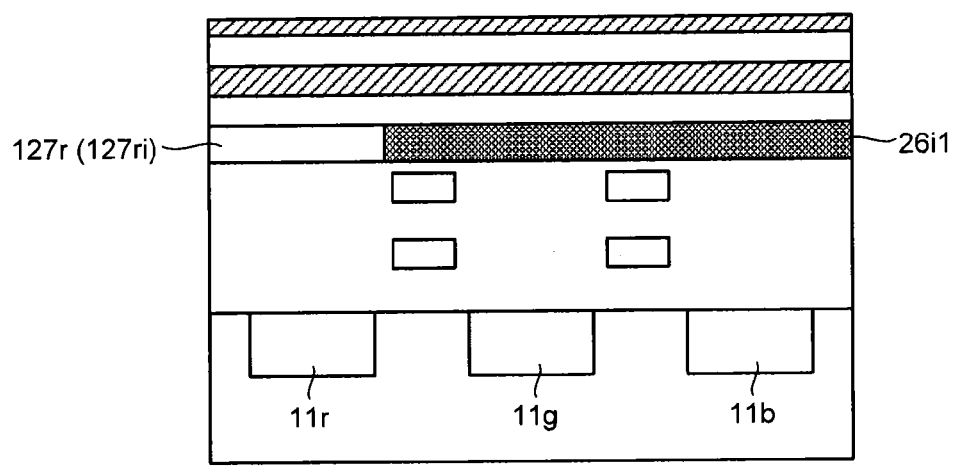

A method for manufacturing the solid-state image sensor 100 differs from that of the first embodiment from a point of view described below, as illustrated in FIGS. 8A to 8C.

That is, after the process illustrated in FIG. 3A, a process illustrated in FIG. 8 is performed. In the process illustrated in FIG. 8A, a layer 26i to be the third layers 26g and 26b is accumulated and formed on the multilayer wiring structures 30r, 30g, and 30b. A resist pattern RP3 is formed using a lithography technique, and covers a part (the third layers 26g and 26b) corresponding to the upper part of the photoelectric conversion layers 11g and 11b in the layer 26i. At this time, a part 26ia corresponding to the upper part of the photoelectric conversion layer 11r in the layer 26i is exposed.

In the process illustrated in FIG. 8B, the part 26ia corresponding to the upper part of the photoelectric conversion layer 11r in a layer 26i1 is etched and removed using the resist pattern RP3 as a mask, using a dry etching technique. After this, the resist pattern RP3 is removed therefrom.

In the process illustrated in FIG. 8C, a layer 127ri to be the fourth layer 127r is formed to cover the layer 26i1 and the multilayer wiring structure 30r. The layer 127ri is planarized until the surface of the layer 26i1 is exposed, to form the fourth layer 127r. Like the process illustrated in FIG. 3B, each of the layers of the lower laminate structures 25r, 25g, and 25b is formed. After this, processes from and after the process of FIG. 3C are performed.

According to the second embodiment, it is possible to easily lower the cross talk (color mixture) on the side of the long wavelength (for example, 600 nm to 800 nm), in the multilayer interference filter 20g of green (G) and the multilayer interference filter 20b of blue (B). Further, light in a wavelength bandwidth of red (R) can efficiently penetrate by the multilayer interference filter 120r of red (R).

Third Embodiment

Descriptions will now be made to a solid-state image sensor 200 according to the third embodiment. The descriptions will hereinafter be made mainly to those parts different from that of the first embodiment.

In the first embodiment, the third layers 26r, 26g, and 26b are provided with an equal film thickness in the multilayer interference filters 20r, 20g, and 20b of respectively red (R), green (G), and blue (B).

In the second embodiment, a third layer 226r of a multilayer interference filter 220r of red (R) is thinner than the third layers 26g and 26b of the multilayer interference filters 20g and 20b of green (G) and blue (B).

Figure 9:
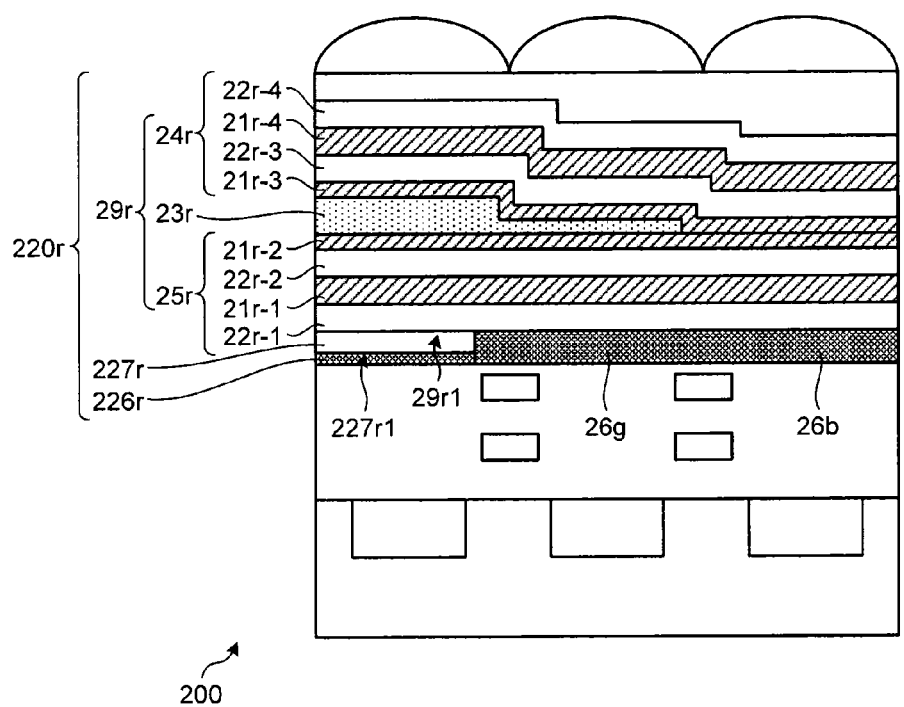
FIG. 9 is a diagram illustrating a configuration of a solid-state image sensor according to a third embodiment.

Specifically, as illustrated in FIG. 9, in the solid-state image sensor 200, the multilayer interference filter 220r of red (R) has a fourth layer 227r and the third layer (sixth layer) 226r in place of the third layer 26r (see FIG. 1).

The fourth layer 227r is in contact with the lower side of the lower surface 29r1 of the laminate structure 29r. That is, the lowermost layer of the laminate structure 29r is the second layer 22r-1, and the fourth layer 227r is in contact with the lower surface of the second layer 22r-1. The fourth layer 227r is formed of a material including, for example, silicon oxide (SiO$_2$) as the main component, and has a fourth refraction index n4 (for example, 1.46). The fourth refraction index n4 is not equal to the first refraction index n1, and is equal to the second refraction index n2. Thus, light in a wavelength bandwidth of red (R) penetrated through the laminate structure 29r can penetrate through the side of the third layer 226r as is.

The third layer 226r is in contact with the lower side of the lower surface 227r1 of the fourth layer 227r. The third layer 226r is formed of a material including, for example, silicon nitride (SiN) as the main component, and has a third refraction index n3 (for example, 2.0). The third refraction n3 is higher than the fourth refraction index n2. Thus, color mixture components of the incident light (that is, a cross talk component on the short wavelength side (400 nm to 500 nm)) can selectively be reflected and removed at the interface of the fourth layer 227r and the third layer 226r.

The third layer 226r in the multilayer interference filter 220r of red (R) has an optical film thickness preferably in a range from 100 nm to 125 nm, and more preferably in a range from 100 nm to 117 nm.

For example, if the optical film thickness of the third layer 226r is equal to or thinner than 125 nm (for example, if the third layer 226r is formed of a material including silicon nitride as the main component, and has a film thickness equal to or thinner than 62 nm), light in a wavelength with a center wavelength of 500 nm or lower can selectively be reflected and removed at the interface of the fourth layer 227r and the third layer 226r.

For example, if the optical film thickness of the third layer 226r is equal to or thinner than 117 nm (for example, if the third layer 226r is formed of a material including silicon nitride as the main component, and has a film thickness equal to or thinner than 58 nm), light in a wavelength with a center wavelength of 470 nm or lower can selectively be reflected and removed at the interface of the fourth layer 227r and the third layer 226r.

Let it be assumed that the optical film thickness of the third layer 226r in the multilayer interference filter 220r of red (R) is thinner than 100 nm. In this case, the center wavelength for reflection becomes too short, thus resulting in difficulty of eliminating cross talk on the side of the short wavelength (400 nm to 500 nm). Let it be assumed that the optical film thickness of the third layer 226r in the multilayer interference filter 220r of red (R) is greater than 125 nm. In this case, the center wavelength of reflection becomes too long, thus resulting in difficulty of eliminating cross talk on the side of the short wavelength (400 nm to 500 nm).

Figure 10A:
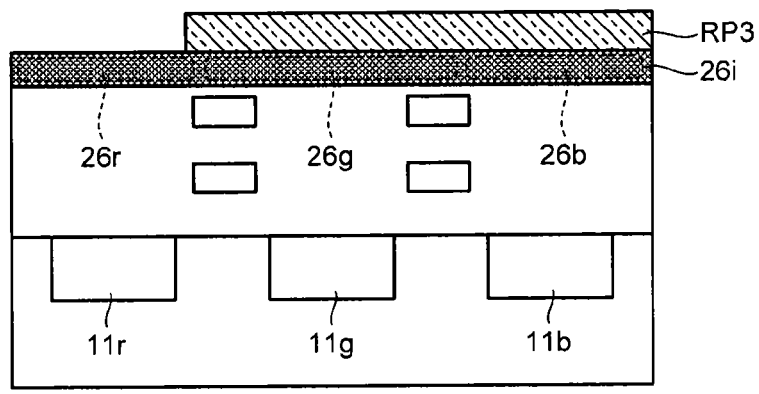
FIG. 10A to FIG. 10C are diagrams each illustrating a method for manufacturing the solid-state image sensor according to the third embodiment.
Figure 10B:
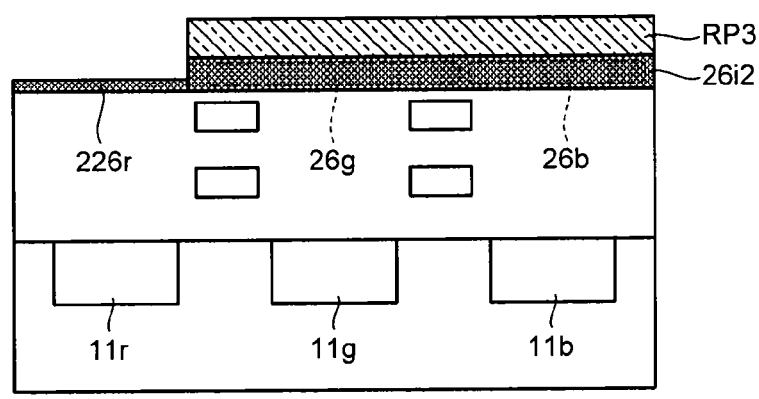
Figure 10C:
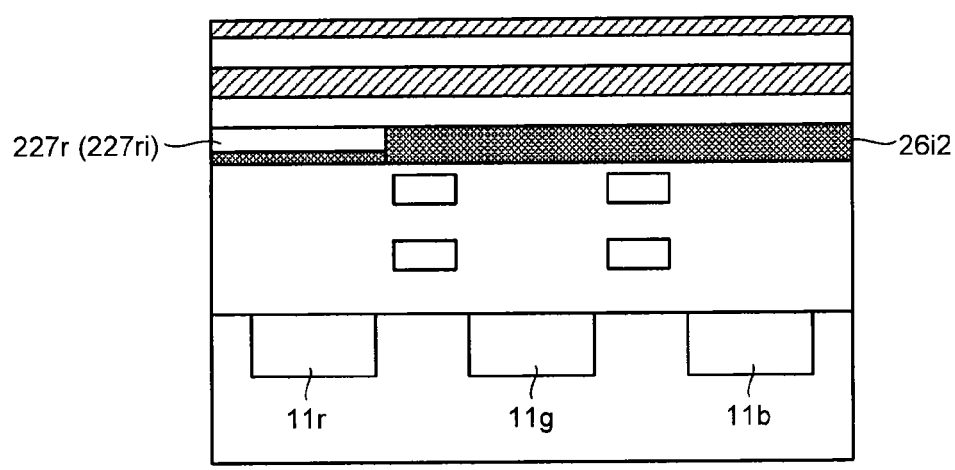

The method for manufacturing the solid-state image sensor 200 differs from that of the first embodiment from a point of view as described below, as illustrated in FIGS. 10A to 10C.

That is, after the process illustrated in FIG. 3A, the process illustrated in FIG. 10A is performed. In the process illustrated in FIG. 10A, the layer 26i to be the third layers 26g and 26b is accumulated and formed on the multilayer wiring structures 30r, 30g, and 30b. The resist pattern RP3 is formed to cover a part (third layers 26g and 26b) corresponding to the upper part of the photoelectric conversion layers 11g and 11b in the layer 26i, using a lithography technique. At this time, the part 26ia corresponding to the upper part of the photoelectric conversion layer 11r in the layer 26i is exposed.

In the process illustrated in FIG. 10B, the part 26ia (see FIG. 10A) corresponding to the upper part of the photoelectric conversion layer 11r in a layer 26i2 is etched (half etched) and thinned up to a film thickness (for example, 50 nm and 62 nm) corresponding to an optical film thickness in a range from 100 nm to 125 nm, using the resist pattern RP3 as a mask. This results in forming a third layer 226r. After this, the resist pattern RP3 is removed.

In the process illustrated in FIG. 100, a layer 227ri to be the fourth layer 227r is formed to cover the layer 26i2 and the third layer 226r. The layer 227ri is planarized until the surface of the layer 26i2 is exposed. Like the process illustrated in FIG. 3B, each of the lower laminate structures 25r, 25g, and 25b is formed. After this, the processes from and after the process of FIG. 3C are performed.

According to the third embodiment, it is possible to easily lower cross talk (color mixture) on the side of the long wavelength (for example, 600 nm to 800 nm) in the multilayer interference filter 20g of green (G) and the multilayer interference filter 20b of blue (B). Further, it is possible to easily lower cross talk (color mixture) on the side of the short wavelength (400 nm to 500 nm) in the multilayer interference filter 220r of red (R).

Fourth Embodiment

Descriptions will now be made to a solid-state image sensor 300 according to the fourth embodiment. The descriptions will hereinafter be made mainly to those parts different from that of the third embodiment.

The third embodiment aimed at lowering the cross talk (color mixture) on the side of the short wavelength (400 nm to 500 nm) in the multilayer interference filter 20r of red (R). The fourth embodiment aims at lowering cross talk (color mixture) on the side of the short wavelength (400 nm to 500 nm) by a multilayer interference filter 320g of green (G).

Figure 11:
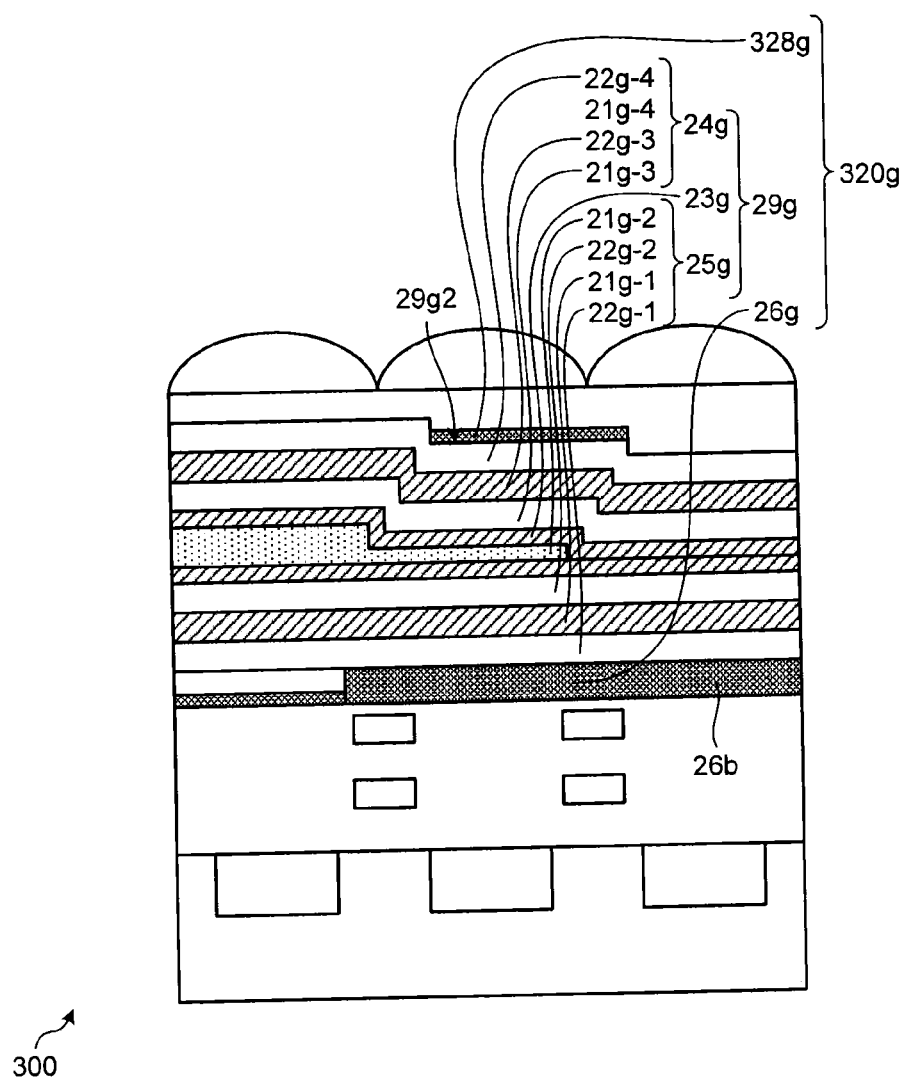
FIG. 11 is a diagram illustrating a configuration of a solid-state image sensor according to a fourth embodiment.

Specifically, as illustrated in FIG. 11, in the solid-state image sensor 200, the multilayer interference filter 320g of green (G) further has a fifth layer 328g.

The fifth layer 328g is in contact with the upper side of an upper surface 29g2 of the laminate structure 29g. That is, the uppermost layer of the laminate structure 29g is a second layer 22g-4, and the fifth layer 328g is in contact with the upper surface of the second layer 22g-4. The fifth layer 328g is formed of a material including silicon nitride (SiN) as the main component, and has a fifth refraction index n5 (for example, 2.0).

The fifth refraction index n5 is not equal to the first refraction index n1, and is higher than the second refraction index n2. For example, if the second refraction index n2 is lower than the first refraction index n1, the fifth refraction index n5 (for example, 2.0) may be lower than the first refraction index n1 (for example, 2.5), and may be higher than the second refraction index n2 (for example, 1.46). As a result, color mixture components of incident light (that is, a cross talk component on the short wavelength side (400 nm to 500 nm)) can selectively be reflected and removed at the interface of the fifth layer 328g and the laminate structure 29g.

In this case, an optical film thickness of the fifth layer 328g in the multilayer interference filter 320g of green (G) is preferably in a range from 100 nm to 125 nm, and preferably in a range from 100 nm to 117 nm. For example, if the optical film thickness of the fifth layer 328g is equal to or lower than 125 nm (if fifth layer 328g is formed of a material including silicon nitride as the main component, and has a film thickness of 62 nm or lower), light in a wavelength with a center wavelength of 500 nm or lower can selectively be reflected and removed at the interface of the fifth layer 328g and the laminate structure 29g.

For example, if the optical film thickness of the third layer 226r is equal to or lower than 117 nm (for example, if the fifth layer 328g is formed of a material including silicon nitride as the main component, and has a film thickness of 58 nm or lower), light in a wavelength bandwidth with a center wavelength of 470 nm or lower can selectively be reflected and removed at the interface of the fifth layer 328g and the laminate structure 29g.

If the optical film thickness of the fifth layer 328g in the multilayer interference filter 320g of green (G) is equal to or lower than 100 nm, the center wavelength for reflection becomes too short, thus resulting in difficulty of eliminating cross talk on the side of the short wavelength (400 nm to 500 nm). Alternatively, if the optical film thickness of the fifth layer 328g in the multilayer interference filter 320g of green (G) is greater than 125 nm, the center wavelength for reflection becomes too long, thus resulting in difficulty of eliminating cross talk on the side of the short wavelength (400 nm to 500 nm).

The method for manufacturing the solid-state image sensor 300 differs from that of the first embodiment from a point of view described below, as illustrated in FIG. 12.

Figure 12A:
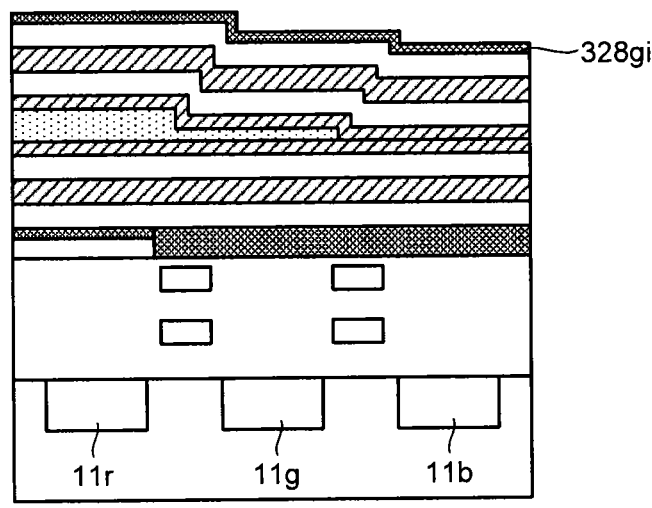
FIG. 12A to FIG. 12C are diagrams each illustrating a method for manufacturing the solid-state image sensor according to the fourth embodiment.

After the process illustrated in FIG. 5B, a process illustrated in FIG. 12A is performed. In the process illustrated in FIG. 12A, a layer 328gi to be the fifth layer 328g is accumulated and formed on the laminate structures 29r, 29g, and 29b (see FIG. 1).

Figure 12B:
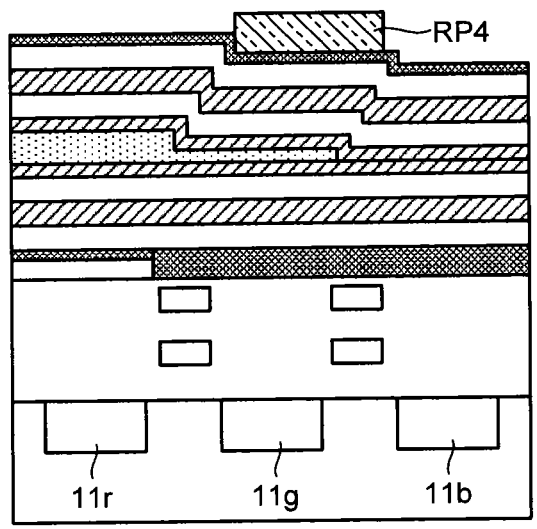

In the process illustrated in FIG. 12B, a resist pattern RP4 is formed using a lithography technique, and covers a part corresponding to the upper part of the photoelectric conversion layer 11g in the layer 328gi. At this time, the part corresponding to the upper part of the photoelectric conversion layers 11r and 11b in the layer 328gi is exposed.

Figure 12C:
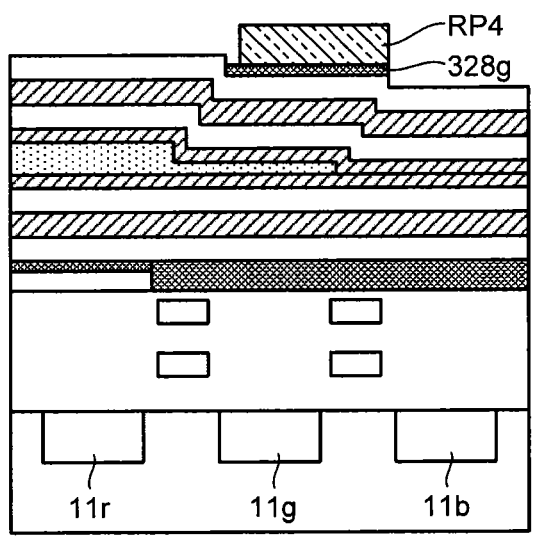

In the process illustrated in FIG. 12C, the part corresponding to the upper part of the photoelectric conversion layers 11r and 11b in the layer 328gi is etched and removed, using the resist pattern RP4 as a mask. After this, the resist pattern RP4 is removed.

According to the fourth embodiment, it is possible to easily lower cross talk (color mixture) on the side of the long wavelength (for example, 600 nm to 800 nm) by the multilayer interference filter of green (G) 320g and the multilayer interference filter of blue (B) 20b. Further, it is possible to easily lower cross talk (color mixture) on the side of the short wavelength (400 nm to 500 nm) by the multilayer interference filter 20r of red (R) and the multilayer interference filter 320g of green (G).

Fifth Embodiment

Descriptions will now be made to a solid-state image sensor 400 according to a fifth embodiment. The descriptions will hereinafter be made mainly to those parts different from those of the first embodiment.

In the first embodiment, the third layers 26r, 26g, and 26b are formed with an equal film thickness in the multilayer interference filters 20r, 20g, and 20b of respectively red (R), green (G), and blue (B).

In the fifth embodiment, a third layer 426r of a multilayer interference filter 420r of red (R) is thinner than the third layers 26g and 26b of the multilayer interference filters 20g and 20b of green (G) and blue (B).

Figure 13:
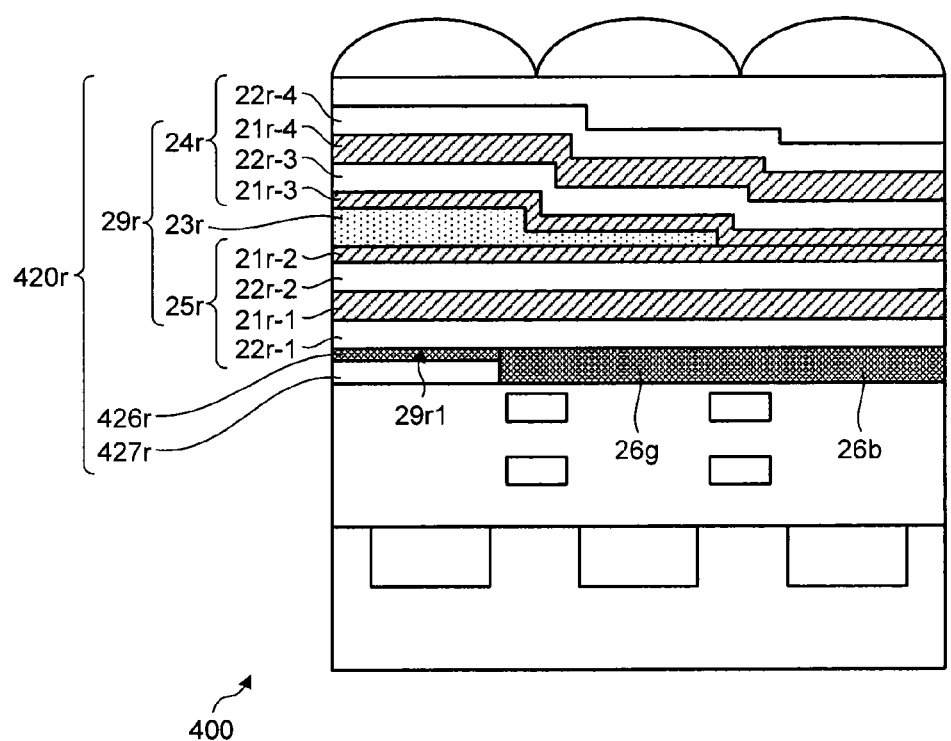
FIG. 13 is a diagram illustrating a configuration of a solid-state image sensor according to a fifth embodiment.

Specifically, as illustrated in FIG. 13, in the solid-state image sensor 400, the multilayer interference filter of red (R) has the third layer (sixth layer) 426r and a fourth layer 427r in place of the third layer 26r (see FIG. 1).

The third layer 426r is in contact with the lower side of the lower surface 29r1 of the laminate structure 29r. That is, the lowermost layer of the laminate structure 29r is the second layer 22r-1, and the third layer 426r is in contact with the lower surface of the second layer 22r-1. The third layer 426r is formed of a material including silicon nitride (SiN) as the main component, and has a third refraction index n3 (for example, 2.0). The third refraction index n3 is higher than the second refraction index n2. Thus, color mixture components of incident light (that is, a cross talk component on the side of the short wavelength (400 nm to 500 nm)) can selectively be reflected removed at the interface of the laminate structure 29r and the third layer 426r.

The fourth layer 427r is arranged below the third layer 426r. The total of the film thickness of the third layer 426r and the film thickness of the fourth layer 427r is equal to the film thickness of, for example, the third layer 26g, and is equal to the film thickness of, for example, the third layer 26b. Thus, the height of the upper surface of the third layer 426r can be arranged at the same level as the height of the upper surface of the third layers 26g and 26b.

The optical film thickness of the third layer 426r in the multilayer interference filter 420r of red (R) is preferably in a range from 100 nm to 125 nm, and more preferably in a range from 100 nm to 117 nm.

For example, if the optical film thickness of the third layer 426r is equal to or lower than 125 nm (for example, if the third layer 426r is formed of a material including silicon nitride as the main component, and has a film thickness of 62 nm or lower), light in a wavelength bandwidth with a center wavelength of 500 nm or lower can selectively be reflected and removed at the interface of the laminate structure 29r and the third layer 426r.

For example, if the optical film thickness of the third layer 426r is equal to or lower than 117 nm (if the third layer 426r is formed of a material including silicon nitride as the main component, and has a film thickness of 58 nm), light in a wavelength with a center wavelength of 470 nm or lower can selectively be reflected and removed at the interface of the laminate structure 29r and the third layer 426r.

If the optical film thickness of the third layer 426r in the multilayer interference filter 420r of red (R) is lower than 100 nm, the center wavelength for reflection becomes too short, thus resulting in difficulty of eliminating cross talk on the side of the short wavelength (400 nm to 500 nm). Alternatively, if the optical film thickness of the third layer 426r in the multilayer interference filter of red (R) is greater than 125 nm, the center wavelength for reflection becomes too long, thus resulting in difficulty of eliminating cross talk on the side of the short wavelength (400 nm to 500 nm).

Figure 14A:
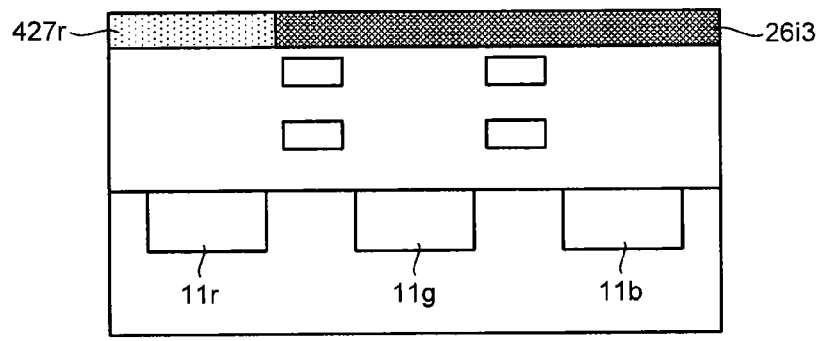
FIG. 14A to FIG. 14C are diagrams each illustrating a method for manufacturing the solid-state image sensor according to the fifth embodiment.
Figure 14B:
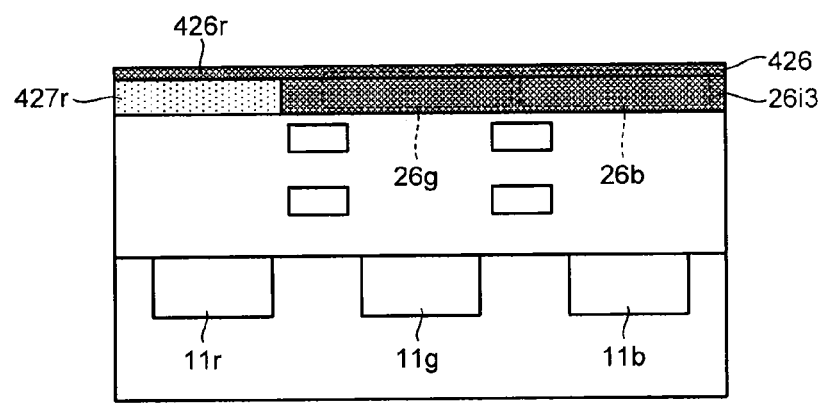
Figure 14C:
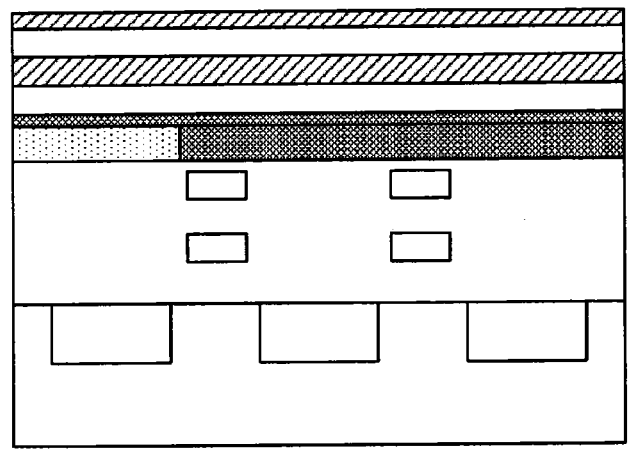

The method for manufacturing the solid-state image sensor 400 differs from that of the first embodiment from a point of view as described below, as illustrated in FIGS. 14A to 14C.

After the process illustrated in FIG. 3A is performed, as illustrated in FIG. 14A, like the processes illustrated in FIG. 8A to FIG. 8C, the fourth layer 427r is formed by planarizing it until the surface of a layer 26i3 is exposed. At this time, the film thickness of the layer 26i3 is formed thin by a thickness value corresponding to the film thickness of the third layer 426r to be formed afterwards, as compared with a target film thickness of the third layers 26g and 26b.

In the process illustrated in FIG. 14B, a layer 426 to be the third layer 426r is accumulated and formed on the fourth layer 427r and the layer 26i3. As a result, the third layers 426g, 26g, and 26b are formed respectively on the photoelectric conversion layers 11r, 11g, and 11b.

In the process illustrated in FIG. 14C, like the process illustrated in FIG. 3B, each of the lower laminate structures 25r, 25g, and 25b is formed. After this, processes from and after FIG. 3C are performed.

According to the fifth embodiment, it is possible to easily lower cross talk (color mixture) on the side of the long wavelength (for example, 600 nm to 800 nm) by the multilayer interference filter of green (G) 20g and the multilayer interference filter of blue (B) 20b. Further, it is possible to easily lower cross talk (color mixture) on the side of the short wavelength (400 nm to 500 nm) by the multilayer interference filter of red (R) 420r.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image sensor comprising a plurality of pixels including a first pixel corresponding to a first color, the first pixel including:
    a first photoelectric conversion layer; and
    a first multilayer interference filter which is arranged to guide, out of incident light, light of the first color selectively to the first photoelectric conversion layer, wherein the first multilayer interference filter includes:
    a first laminate structure in which a first layer having a first refraction index and a second layer having a second refraction index are repeatedly laminated, a lowermost layer of the first laminate structure being the second layer, and
    a third layer which is in contact with a lower surface of the lowermost second layer and has a third refraction index, and
    the third refraction index is not equal to the first refraction index and is higher than the second refraction index.

2. The solid-state image sensor according to claim 1, wherein
    the third layer has an optical film thickness equal to or lower than 225 nm.

3. The solid-state image sensor according to claim 2, wherein:
    the third layer is formed of a material including silicon nitride as a main component; and
    the third layer has a film thickness equal to or lower than 112 nm.

4. The solid-state image sensor according to claim 1, wherein
    the third layer has an optical film thickness equal to or lower than 200 nm.

5. The solid-state image sensor according to claim 4, wherein:
    the third layer is formed of a material including silicon nitride as a main component; and
    the third layer has a film thickness equal to or lower than 100 nm.

6. The solid-state image sensor according to claim 1, wherein
    the third layer has an optical film thickness equal to or lower than 175 nm.

7. The solid-state image sensor according to claim 6, wherein:
    the third layer is formed of a material including silicon nitride as a main component; and the third layer has a film thickness equal to or lower than 88 nm.

8. The solid-state image sensor according to claim 1, wherein:
the third layer has an optical film thickness equal to or lower than 150 nm.

9. The solid-state image sensor according to claim 8, wherein:
the third layer is formed of a material including silicon nitride as a main component; and
the third layer has a film thickness equal to or lower than 75 nm.

10. The solid-state image sensor according to claim 1, wherein
the third layer has an optical film thickness equal to or greater than 125 nm.

11. The solid-state image sensor according to claim 10, wherein:
the third layer is formed of a material including silicon nitride as a main component; and
the third layer has a film thickness equal to or greater than 62 nm.

12. The solid-state image sensor according to claim 1, wherein:
the second refraction index is lower than the first refraction index; and
the third refraction index is lower than the first refraction index and higher than the second refraction index.

13. The solid-state image sensor according to claim 1, wherein
the plurality of pixels further include a second pixel corresponding to a second color different from the first color,
the second pixel including:
a second photoelectric conversion layer; and
a second multilayer interference filter which is arranged to guide, out of incident light, light of the second color selectively to the second photoelectric conversion layer, and wherein
the second multilayer interference filter includes:
a second laminate structure in which the first layer and the second layer are repeatedly laminated, and
a fourth layer which is in contact with a lower surface of the second laminate structure and has a fourth refraction index,
a lowermost layer of the second laminate structure is the second layer, and
the fourth refraction index is not equal to the first refraction index, and is equal to the second refraction index.

14. The solid-state image sensor according to claim 13, wherein
the fourth layer has a film thickness substantially equal to a film thickness of the third layer.

15. The solid-state image sensor according to claim 13, wherein
a film thickness of the fourth layer is thinner than a film thickness of the third layer.

16. The solid-state image sensor according to claim 13, wherein
the second multilayer interference filter further has a sixth layer, which is in contact with a lower surface of the fourth layer and has the third refraction index.

17. The solid-state image sensor according to claim 16, wherein
total of a film thickness of the fourth layer and a film thickness of the sixth layer is substantially equal to a film thickness of the third layer.

18. The solid-state image sensor according to claim 1, wherein
the plurality of pixels further includes a third pixel corresponding to a third color different from the first color,
the third pixel including:
a third photoelectric conversion layer; and
a third multilayer interference filter which is arranged to guide, out of incident light, light of the third color selectively to the third photoelectric conversion layer, and wherein
the third multilayer interference filter includes:
a third laminate structure in which the first layer and the second layer are repeatedly laminated, a lowermost layer of the third laminate structure being the second layer, and
a seventh layer which is in contact with a lower surface of the third laminate structure and has the third refraction index,
the first multilayer interference filter further includes:
a fifth layer which is in contact with an upper surface of the first laminate structure and has a fifth refraction index, and wherein
an uppermost layer of the first laminate structure is the second layer, and
the fifth refraction index is not equal to the first refraction index and is higher than the second refraction index.

19. The solid-state image sensor according to claim 1, wherein
the plurality of pixels further include a second pixel corresponding to a second color different from the first color,
the second pixel including:
a second photoelectric conversion layer; and
a second multilayer interference filter which is arranged to guide, out of incident light, light of the second color selectively to the second photoelectric conversion layer, and wherein
the second multilayer interference filter includes:
a second laminate structure in which the first layer and the second layer are repeatedly laminated,
a sixth layer which is in contact with a lower surface of the second laminate structure and has the third refraction index, and
a fourth layer which is in contact with a lower surface of the sixth layer and has a fourth refraction index, wherein
a lowermost layer of the second laminate structure is the second layer, and
the fourth refraction index is not equal to the first refraction index, and is equal to the second refraction index.

20. The solid-state image sensor according to claim 19, wherein
total of a film thickness of the sixth layer and a film thickness of the fourth layer is substantially equal to a film thickness of the third layer.

* * * * *